(12) United States Patent
Andrews et al.

(10) Patent No.: US 10,897,000 B2
(45) Date of Patent: Jan. 19, 2021

(54) LIGHT EMITTING DIODES, COMPONENTS AND RELATED METHODS

(71) Applicant: Cree, Inc., Durham, NC (US)

(72) Inventors: Peter Scott Andrews, Durham, NC (US); Jesse Colin Reiherzer, Raleigh, NC (US); Amber C. Abare, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/380,400

(22) Filed: Apr. 10, 2019

(65) Prior Publication Data

US 2019/0237638 A1  Aug. 1, 2019

Related U.S. Application Data

(63) Continuation of application No. 15/657,027, filed on Jul. 21, 2017, now Pat. No. 10,290,777.

(Continued)

(51) Int. Cl.
*H01L 33/50* (2010.01)
*H01L 33/60* (2010.01)
(Continued)

(52) U.S. Cl.
CPC ........ *H01L 33/507* (2013.01); *H01L 25/0753* (2013.01); *H01L 33/502* (2013.01);
(Continued)

(58) Field of Classification Search
CPC . H01L 25/0753; H01L 33/507; H01L 33/502; H01L 33/505; H01L 33/60;
(Continued)

(56) References Cited

U.S. PATENT DOCUMENTS 2,857,541 A    10/1958  Etzel et al.
4,918,497 A    4/1990   Edmond
(Continued)

FOREIGN PATENT DOCUMENTS

CN    103864302 A    6/2014
EP    1710846 A1    10/2006
(Continued)

OTHER PUBLICATIONS

Nichia Corporation, "NC3W321AT: Specifications for White LED," Nichia STS-DA1-4281A <Cat.No. 160603>, [online], [retrieved on May 21, 2018] Retrieved from Nichia Corporation using Internet <URL: http://www.nichia.co.jp/en/product/led.html>, 16 pages.
(Continued)

*Primary Examiner* — Stephen W Smoot
(74) *Attorney, Agent, or Firm* — Withrow & Terranova, P.L.L.C.

(57) ABSTRACT

Light emitting diodes, components, and related methods, with improved performance over existing light emitting diodes. In some embodiments, light emitter devices included herein include a submount, a light emitter, a light affecting material, and a wavelength conversion component. Wavelength conversion components provided herein include a transparent substrate having an upper surface and a lower surface, and a phosphor compound disposed on the upper surface or lower surface, wherein the wavelength conversion component is configured to alter a wavelength of a light emitted from a light source when positioned proximate to the light source.

20 Claims, 7 Drawing Sheets

Related U.S. Application Data

(60) Provisional application No. 62/366,961, filed on Jul. 26, 2016.

(51) Int. Cl.
*H01L 33/62* (2010.01)
*H01L 25/075* (2006.01)
*H01L 33/54* (2010.01)
*H01L 33/56* (2010.01)
*H01L 33/58* (2010.01)

(52) U.S. Cl.
CPC ............ *H01L 33/505* (2013.01); *H01L 33/60* (2013.01); *H01L 33/62* (2013.01); *H01L 33/501* (2013.01); *H01L 33/54* (2013.01); *H01L 33/56* (2013.01); *H01L 33/58* (2013.01); *H01L 2224/16225* (2013.01); *H01L 2933/005* (2013.01); *H01L 2933/0041* (2013.01); *H01L 2933/0058* (2013.01); *H01L 2933/0091* (2013.01)

(58) Field of Classification Search
CPC ....... H01L 33/62; H01L 33/501; H01L 33/54; H01L 33/56; H01L 33/58; H01L 2933/0041; H01L 2933/005; H01L 2933/0058; H01L 2933/0091
USPC .......................................................... 257/88
See application file for complete search history.

(56) References Cited

U.S. PATENT DOCUMENTS

| | | |
|---|---|---|
| 4,966,862 A | 10/1990 | Edmond |
| 5,027,168 A | 6/1991 | Edmond |
| 5,177,500 A | 1/1993 | Ng |
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,034,422 A | 3/2000 | Horita et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,274,399 B1 | 8/2001 | Kern et al. |
| 6,600,175 B1 | 7/2003 | Baretz et al. |
| 6,646,330 B2 | 11/2003 | Kubara et al. |
| 6,649,440 B1 | 11/2003 | Krames et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,344,902 B2 | 3/2008 | Basin et al. |
| 7,361,938 B2 | 4/2008 | Mueller et al. |
| D572,387 S | 7/2008 | Uemoto et al. |
| D573,731 S | 7/2008 | Uemoto et al. |
| 7,456,499 B2 | 11/2008 | Loh et al. |
| 7,564,180 B2 | 7/2009 | Brandes |
| D597,502 S | 8/2009 | Ogata et al. |
| 7,655,957 B2 | 2/2010 | Loh et al. |
| D611,628 S | 3/2010 | Uemoto et al. |
| D612,958 S | 3/2010 | Uemoto et al. |
| 7,754,507 B2 | 7/2010 | Epler et al. |
| 7,791,061 B2 | 9/2010 | Edmond et al. |
| 7,802,901 B2 | 9/2010 | McMillan |
| 7,821,023 B2 | 10/2010 | Yuan et al. |
| 7,847,303 B2 | 12/2010 | Jung et al. |
| 7,928,648 B2 | 4/2011 | Jang et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,058,088 B2 | 11/2011 | Cannon et al. |
| 8,075,165 B2 | 12/2011 | Jiang et al. |
| 8,125,137 B2 | 2/2012 | Medendorp, Jr. et al. |
| 8,232,564 B2 | 7/2012 | Chakraborty |
| 8,264,138 B2 | 9/2012 | Negley et al. |
| 8,337,071 B2 | 12/2012 | Negley et al. |
| 8,362,512 B2 | 1/2013 | Hussell et al. |
| 8,384,097 B2 | 2/2013 | Yan |
| 8,390,022 B2 | 3/2013 | Hussell et al. |
| 8,410,679 B2 | 4/2013 | Ibbetson et al. |
| 8,425,271 B2 | 4/2013 | Hussell et al. |
| 8,563,339 B2 | 10/2013 | Tarsa et al. |
| 8,598,793 B2 | 12/2013 | Yan et al. |
| D703,841 S | 4/2014 | Feng et al. |
| 8,729,589 B2 | 5/2014 | Hussell et al. |
| 8,822,032 B2 | 9/2014 | Borrelli et al. |
| 8,866,410 B2 | 10/2014 | Negley et al. |
| 8,940,561 B2 | 1/2015 | Donofrio et al. |
| 8,970,131 B2 | 3/2015 | Brandes et al. |
| 8,998,444 B2 | 4/2015 | Roberts et al. |
| 9,024,340 B2 | 5/2015 | Minato et al. |
| 9,024,349 B2 | 5/2015 | Chitnis et al. |
| 9,053,958 B2 | 6/2015 | Donofrio et al. |
| 9,131,561 B2 | 9/2015 | Athalye |
| 9,159,888 B2 | 10/2015 | Chitnis et al. |
| 9,192,013 B1 | 11/2015 | van de Ven et al. |
| 9,277,605 B2 | 3/2016 | Ni |
| 9,310,026 B2 | 4/2016 | Negley |
| D756,547 S | 5/2016 | Zhang et al. |
| 9,414,454 B2 | 8/2016 | Brandes et al. |
| 9,461,222 B1 | 10/2016 | Wei |
| 9,713,211 B2 | 7/2017 | van de Ven et al. |
| D797,321 S | 9/2017 | Liu |
| 9,816,691 B2 | 11/2017 | Yan |
| 9,893,243 B2 | 2/2018 | West et al. |
| 10,057,983 B1 | 8/2018 | Etzkorn et al. |
| 10,211,187 B2 | 2/2019 | Crompvoets et al. |
| D851,790 S | 6/2019 | Reiherzer et al. |
| 10,651,353 B2 | 5/2020 | Senuki et al. |
| 2004/0048219 A1 | 3/2004 | Yun |
| 2005/0127385 A1 | 6/2005 | Reeh et al. |
| 2006/0221272 A1 | 10/2006 | Negley et al. |
| 2007/0104828 A1 | 5/2007 | Fornaguera |
| 2007/0241661 A1 | 10/2007 | Yin |
| 2008/0258130 A1 | 10/2008 | Bergmann et al. |
| 2009/0001490 A1 | 1/2009 | Bogner et al. |
| 2009/0021841 A1 | 1/2009 | Negley et al. |
| 2009/0039375 A1 | 2/2009 | LoToquin et al. |
| 2009/0050908 A1 | 2/2009 | Yuan et al. |
| 2009/0051022 A1 | 2/2009 | Andoh |
| 2009/0166665 A1 | 7/2009 | Haitko |
| 2009/0261708 A1 | 10/2009 | Moseri et al. |
| 2009/0316409 A1 | 12/2009 | Kim et al. |
| 2010/0154035 A1 | 6/2010 | Damola et al. |
| 2010/0244060 A1 | 9/2010 | Lee et al. |
| 2010/0320928 A1 | 12/2010 | Kaihotsu et al. |
| 2011/0018017 A1 | 1/2011 | Bierhuizen et al. |
| 2011/0031516 A1 | 2/2011 | Basin et al. |
| 2011/0049545 A1 | 3/2011 | Basin et al. |
| 2011/0068702 A1 | 3/2011 | van de Ven et al. |
| 2011/0180822 A1 | 7/2011 | Ruhnau et al. |
| 2011/0254022 A1 | 10/2011 | Sasano |
| 2011/0309388 A1 | 12/2011 | Ito et al. |
| 2012/0061692 A1 | 3/2012 | Chang |
| 2012/0086023 A1 | 4/2012 | Veerasamy et al. |
| 2012/0104452 A1 | 5/2012 | Miyoshi et al. |
| 2012/0107622 A1 | 5/2012 | Borrelli et al. |
| 2012/0111471 A1 | 5/2012 | Negley et al. |
| 2012/0193651 A1 | 8/2012 | Edmond et al. |
| 2012/0305949 A1 | 12/2012 | Donofrio et al. |
| 2012/0306355 A1 | 12/2012 | Seibel, II |
| 2013/0033169 A1 | 2/2013 | Ito et al. |
| 2013/0057593 A1 | 3/2013 | Morishita |
| 2013/0069781 A1 | 3/2013 | Terwilliger et al. |

(56) References Cited

U.S. PATENT DOCUMENTS

| | | |
|---|---|---|
| 2013/0077299 A1 | 3/2013 | Hussell et al. |
| 2013/0092960 A1 | 4/2013 | Wilcox et al. |
| 2013/0221509 A1 | 8/2013 | Oda et al. |
| 2013/0256710 A1 | 10/2013 | Andrews et al. |
| 2013/0256711 A1 | 10/2013 | Joo et al. |
| 2013/0264589 A1 | 10/2013 | Bergmann et al. |
| 2013/0271991 A1 | 10/2013 | Hussell et al. |
| 2014/0217325 A1 | 8/2014 | Manabe et al. |
| 2014/0217435 A1 | 8/2014 | Bergmann et al. |
| 2014/0217436 A1 | 8/2014 | Hussell et al. |
| 2014/0217443 A1 | 8/2014 | Heikman et al. |
| 2014/0239320 A1 | 8/2014 | Miyoshi et al. |
| 2014/0367713 A1 | 12/2014 | Zhang et al. |
| 2015/0028372 A1 | 1/2015 | Nakanishi et al. |
| 2015/0062915 A1 | 3/2015 | Hussell et al. |
| 2015/0155447 A1* | 6/2015 | Beppu ............ H01L 33/50 257/98 |
| 2015/0204525 A1 | 7/2015 | Shen et al. |
| 2015/0207045 A1 | 7/2015 | Wada et al. |
| 2015/0257211 A1 | 9/2015 | Johnson et al. |
| 2015/0262987 A1 | 9/2015 | Wada et al. |
| 2015/0263247 A1 | 9/2015 | Wada et al. |
| 2015/0349218 A1 | 12/2015 | Reiherzer et al. |
| 2015/0364660 A1 | 12/2015 | Huang et al. |
| 2016/0064623 A1 | 3/2016 | Clatterbuck |
| 2016/0074833 A1 | 3/2016 | O'Brien et al. |
| 2016/0079486 A1 | 3/2016 | Sugimoto et al. |
| 2016/0093777 A1 | 3/2016 | Sato et al. |
| 2016/0126434 A1 | 5/2016 | Nakabayashi |
| 2016/0161098 A1 | 6/2016 | Tudorica et al. |
| 2016/0293811 A1 | 10/2016 | Hussell et al. |
| 2016/0351846 A1 | 12/2016 | Kim et al. |
| 2017/0040183 A1 | 2/2017 | Sakai et al. |
| 2017/0098746 A1 | 4/2017 | Bergmann et al. |
| 2017/0154880 A1 | 6/2017 | Ozeki et al. |
| 2017/0294417 A1 | 10/2017 | Edmond et al. |
| 2017/0301832 A1 | 10/2017 | Basin et al. |
| 2017/0373225 A1 | 12/2017 | Shichijo et al. |
| 2018/0033924 A1 | 2/2018 | Andrews et al. |
| 2018/0069164 A1 | 3/2018 | Minato et al. |
| 2018/0076368 A1 | 3/2018 | Hussell |
| 2018/0102348 A1 | 4/2018 | Haiberger et al. |
| 2018/0102449 A1 | 4/2018 | Pschenitzka et al. |
| 2018/0103513 A1 | 4/2018 | Tseng et al. |
| 2018/0130776 A1 | 5/2018 | Oka |
| 2018/0190880 A1 | 7/2018 | Vampola et al. |
| 2018/0190881 A1 | 7/2018 | Lin |
| 2018/0190885 A1 | 7/2018 | Chang et al. |
| 2019/0148346 A1 | 5/2019 | Feichtinger et al. |
| 2019/0165231 A1 | 5/2019 | Doan et al. |
| 2019/0312187 A1 | 10/2019 | Harada et al. |
| 2019/0363223 A1 | 11/2019 | Murthy et al. |
| 2019/0363232 A1 | 11/2019 | Murthy et al. |
| 2020/0075813 A1 | 3/2020 | Joo et al. |
| 2020/0075822 A1 | 3/2020 | Suich et al. |
| 2020/0152840 A1 | 5/2020 | Hussell |

FOREIGN PATENT DOCUMENTS

| | | |
|---|---|---|
| EP | 2216834 A1 | 8/2010 |
| EP | 2768037 A1 | 9/2012 |
| EP | 2819191 A1 | 12/2014 |
| WO | 2011007275 A1 | 1/2011 |
| WO | 2012058040 A1 | 5/2012 |
| WO | 2013154818 A1 | 10/2013 |
| WO | 2014024108 A1 | 2/2014 |
| WO | 2014133294 A1 | 9/2014 |
| WO | 2018022456 A1 | 2/2018 |

OTHER PUBLICATIONS

Nichia Corporation, "NC2W321AT: Specifications for White LED," Nichia STS-DA1-4323A <Cat.No. 160711>, [online], [retrieved on May 21, 2018] Retrieved from Nichia Corporation using Internet <URL: http://www.nichia.co.jp/en/product/led.html>, 16 pages.

Nichia Corporation, "NC4W321AT: Specifications for White LED," Nichia STS-DA1-4325A <Cat.No. 160711>, [online], [retrieved on May 21, 2018] Retrieved from Nichia Corporation using Internet <URL: http://www.nichia.co.jp/en/product/led.html>, 16 pages.

International Search Report and Written Opinion for International Patent Application No. PCT/US2017/043316, dated Sep. 1, 2017, 13 pages.

Non-Final Office Action for U.S. Appl. No. 15/657,027, dated Apr. 10, 2018, 11 pages.

Final Office Action for U.S. Appl. No. 15/657,027, dated Oct. 19, 2018, 17 pages.

Notice of Allowance for U.S. Appl. No. 15/657,027, dated Dec. 28, 2018, 9 pages.

International Preliminary Report on Patentability for International Patent Application No. PCT/US2017/043316, dated Feb. 7, 2019, 9 pages.

Invitation to Pay Additional Fees and Partial International Search for International Patent Application No. PCT/US2019/028704, dated Jul. 17, 2019, 14 pages.

International Search Report and Written Opinion for International Patent Application No. PCT/US2019/028704, dated Sep. 9, 2019, 18 pages.

Invitation to Pay Additional Fees and Partial International Search for International Patent Application No. PCT/US2019/028708, dated Jul. 17, 2019, 17 pages.

International Search Report and Written Opinion for International Patent Application No. PCT/US2019/028708, dated Sep. 9, 2019, 20 pages.

Non-Final Office Action for U.S. Appl. No. 16/118,762, dated Oct. 1, 2019, 36 pages.

Restriction Requirement for U.S. Appl. No. 29/661,900, dated Nov. 25, 2019, 6 pages.

Non-Final Office Action for U.S. Appl. No. 16/118,747, dated Jan. 29, 2020, 28 pages.

Final Office Action for U.S. Appl. No. 16/118,762, dated Feb. 14, 2020, 44 pages.

Non-Final Office Action for U.S. Appl. No. 16/118,779, dated Jan. 10, 2020, 27 pages.

Examination Report for European Patent Application No. 17748998.6, dated Jan. 3, 2020, 7 pages.

Advisory Action, Applicant-Initiated Interview Summary, and AFCP 2.0 Decision for U.S. Appl. No. 16/118,762, dated Apr. 24, 2020, 9 pages.

Non-Final Office Action for U.S. Appl. No. 16/118,762, dated May 26, 2020, 25 pages.

Notice of Allowance for U.S. Appl. No. 29/661,900, dated Apr. 29, 2020, 6 pages.

Author Unknown, "Black Silicon," Wikipedia [online], <https://web.archive.org/web/20150401161824/http://en.wikipedia.org/wiki/Black_Silicon> Apr. 1, 2015, 1 page.

Final Office Action for U.S. Appl. No. 16/118,747, dated Jun. 9, 2020, 43 pages.

Non-Final Office Action for U.S. Appl. No. 16/545,357, dated Jun. 24, 2020, 33 pages.

Notice of Allowance for U.S. Appl. No. 16/797,173, dated Jun. 22, 2020, 10 pages.

Examination Report for European Patent Application No. 17748998.6, dated Jun. 25, 2020, 7 pages.

Final Office Action for U.S. Appl. No. 16/118,779, dated Jul. 15, 2020, 35 pages.

Advisory Action for U.S. Appl. No. 16/118,347, dated Aug. 18, 2020, 3 pages.

Advisory Action and Applicant-Initiated Interview Summary for U.S. Appl. No. 16/118,747, dated Aug. 4, 2020, 5 pages.

Non-Final Office Action for U.S. Appl. No. 16/118,747, dated Sep. 8, 2020, 32 pages.

Notice of Allowance for U.S. Appl. No. 16/791,173, dated Aug. 24, 2020, 9 pages.

(56) References Cited

OTHER PUBLICATIONS

International Search Report and Written Opinion for International Patent Application No. PCT/US2020/038960, dated Aug. 11, 2020, 17 pages.
Advisory Action and Applicant-Initiated Interview Summary for U.S. Appl. No. 16/118,779, dated Nov. 20, 2020, 5 pages.
Final Office Action for U.S. Appl. No. 16/545,357, dated Dec. 7, 2020, 41 pages.

* cited by examiner

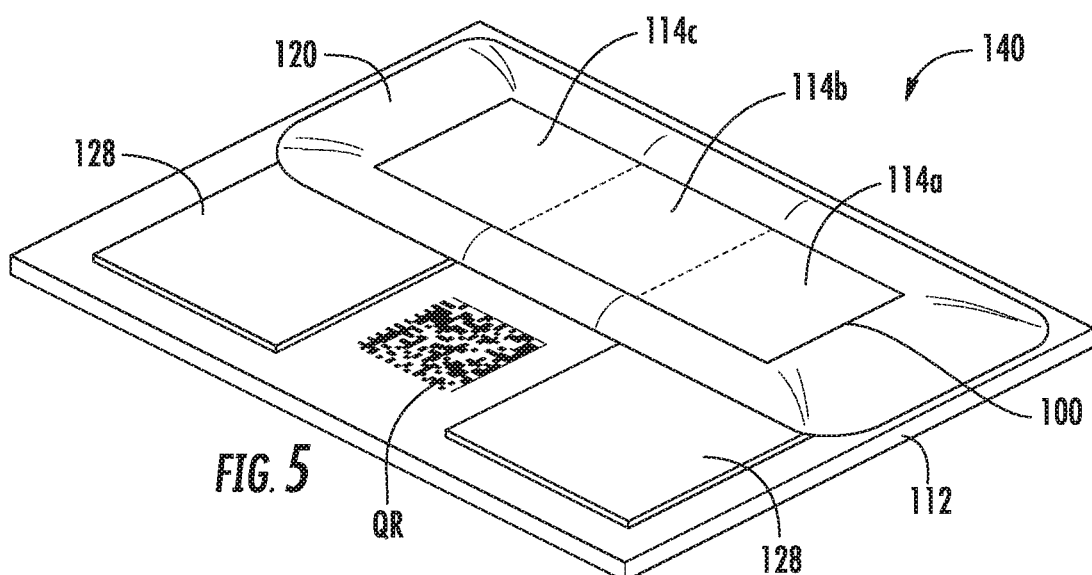
FIG. 5
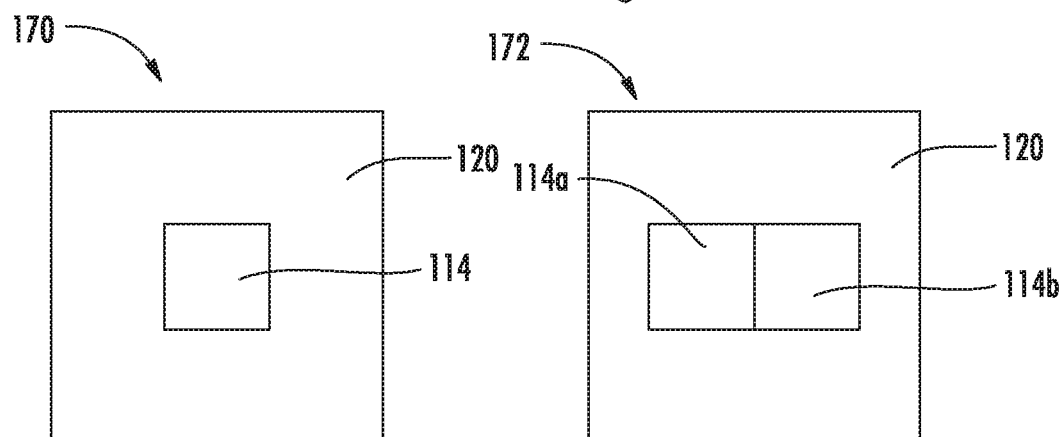
FIG. 6A
FIG. 6B
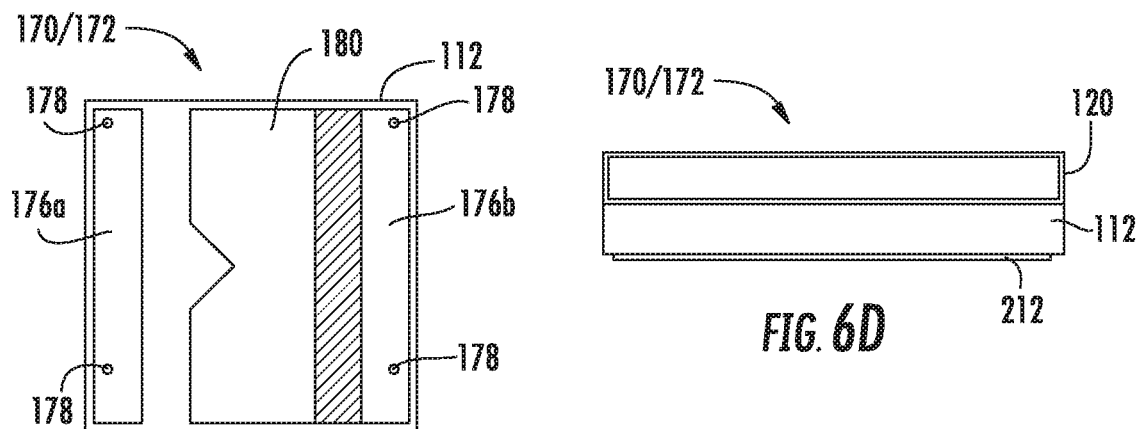
FIG. 6C
FIG. 6D

LIGHT EMITTING DIODES, COMPONENTS AND RELATED METHODS

CROSS REFERENCE TO RELATED APPLICATION

This application is a continuation of U.S. patent application Ser. No. 15/657,027 filed on Jul. 21, 2017, which was published as U.S. Patent Application Publication No. 2018/0033924 A1 and patented as U.S. Pat. No. 10,290,777, and claims priority to U.S. Provisional Patent Application Ser. No. 62/366,961, filed on Jul. 26, 2016, wherein the entire disclosures of the foregoing applications are incorporated by reference herein.

TECHNICAL FIELD

The subject matter disclosed herein relates generally to light emitting diodes (LEDs), components, and related methods. More particularly, the subject matter disclosed herein relates to devices, components and methods to improve emitting performance of LEDs.

BACKGROUND

Light emitting diodes or LED chips are solid state devices that convert electrical energy into light. LED chips can be utilized in light emitter devices or components for providing different colors and patterns of light useful in various lighting and optoelectronic applications. Light emitter devices can include surface mount devices (SMDs) which can be mounted directly onto the surface of an underlying circuit component or heat sink, such as a printed circuit board (PCB) or metal core printed circuit board (MCPCB). SMDs can comprise bottom electrical contacts or leads configured to directly mount to the underlying circuit component. SMDs can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers, and encourage the adoption of LED products. Devices and components incorporating fewer raw materials at sustained or increased brightness levels are desired. Moreover, LEDs that produce light at optimal outputs and under enhance performance, particularly while using the same or less power, are becoming more desirable.

Thus, despite the availability of various light emitter devices and components in the marketplace, a need remains for devices, components, and methods which can be produced quickly, efficiently, at a lower cost, and with improved performance characteristics.

SUMMARY

In accordance with this disclosure, substrate based LEDs, components, and related methods having improved manufacturability and customization are provided and described herein. Devices, components, and methods described herein can advantageously exhibit improved processing times, ease of manufacture, and/or lower processing costs. Devices, components, and related methods described herein can be well suited for a variety of applications such as personal, industrial, and commercial lighting applications including, for example, light bulbs and light fixture products and/or applications. In some aspects, devices, components, and related methods described herein can comprise improved (e.g., less expensive and more efficient) manufacturing processes and/or improved optical properties including consistent color targeting and improved reflection.

Solid state lighting apparatuses, such as LEDs, systems, and related methods are provided. An example apparatus can comprise, for example: a substrate; a plurality of electrically conductive traces disposed over the substrate; one or more LEDs each electrically connected to at least two of the electrically conductive traces; a reflective material and/or a phosphor or other color conversion component.

These and other objects of the present disclosure as can become apparent from the disclosure herein are achieved, at least in whole or in part, by the subject matter disclosed herein.

BRIEF DESCRIPTION OF DRAWINGS

A full and enabling disclosure of the present subject matter is set forth more particularly in the remainder of the specification, including reference to the accompanying figures, relating to one or more embodiments, in which:

FIG. 5 is a perspective view of an example LED device;

FIGS. 6A through 6E are various illustrations of example LED devices;

DETAILED DESCRIPTION

Figure 1A:
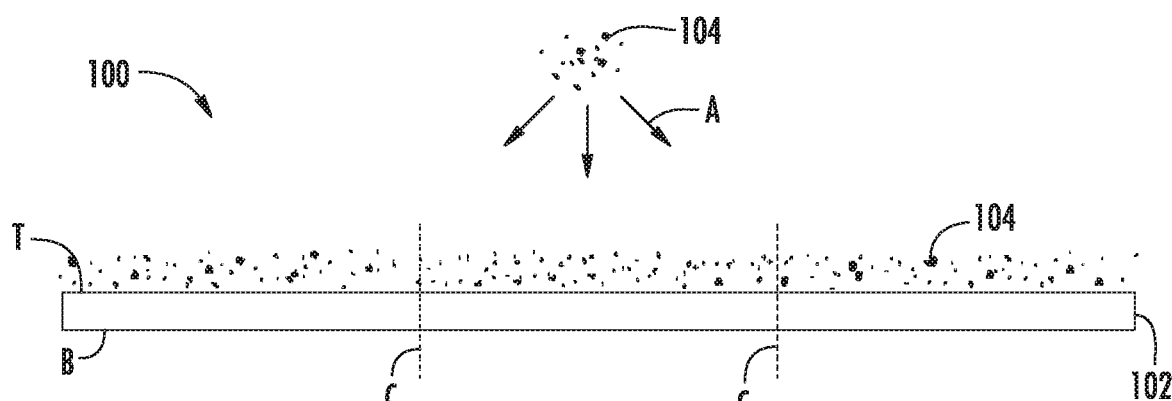
FIGS. 1A through 1C are various illustrations of example wavelength conversion components.

In some aspects, solid state lighting apparatuses and methods described herein can comprise various solid state light emitter electrical configurations, color combinations, and/or circuitry components for providing solid state lighting apparatuses having improved efficiency, improved color mixing, and/or improved color rendering. Apparatuses and methods such as those disclosed herein advantageously cost less, are more efficient, vivid, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising," "including," and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LED chips are electrically connected, such as in series, in parallel, in mixed series/parallel, in common anode, or in common anode configurations among mutually exclusive groups/segments/sets. The segments of LED chips can be configured in a number of different ways and may have circuits of varying functionality associated therewith (e.g. driver circuits, rectifying circuits, current limiting circuits, shunts, bypass circuits, etc.), as discussed, for example, in commonly assigned U.S. Pat. Nos. 9,713,211, 8,970,131, 9,414,454, 9,131,561, 9,277,605, and 8,729,589, wherein the disclosure of each of the foregoing patents is hereby incorporated by reference herein.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned U.S. Pat. No. 8,866,410, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LED chips) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards PCBs and/or related components (e.g., including but not limited to metal core printed circuit boards (MCPCBs), flexible circuit boards, dielectric laminates, ceramic based substrates, and the like, or ceramic boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some aspects, a single, unitary substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

Solid state lighting apparatuses according to aspects of the subject matter herein can comprise III-V nitride (e.g., gallium nitride) based LED chips or laser chips fabricated on a silicon, silicon carbide, sapphire, or III-V nitride growth substrate, including (for example) chips manufactured and sold by Cree, Inc. of Durham, N.C. Such LED chips and/or lasers can be configured to operate such that light emission occurs through the substrate in a so-called "flip chip" orientation. Such LED and/or laser chips can also be devoid of growth substrates (e.g., following growth substrate removal). In some cases, LED chips can comprise red— III-V chips, but not nitride such as InGaAIP, GaAsP, and the like.

LED chips useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LED chips having a planarized coating of phosphor integrated therewith are discussed by way of example in U.S. Pat. No. 8,232,564, the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LED chips of different colors, one or more of which can be white emitting (e.g., including at least one LED chip with one or more lumiphoric materials).

In some aspects, one or more short wavelength solid state emitters (e.g., blue and/or cyan LED chips) can be used to stimulate emissions from a mixture of lumiphoric materials, or discrete layers of lumiphoric material, including red, yellow, and green lumiphoric materials. LED chips of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. Nos. 6,600,175 and 8,018,135, each disclosure of which is hereby incorporated by reference herein in the entirety, are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color. In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selective activating sets of solid state emitters according to the present subject matter may be provided using the circuitry and/or techniques described in commonly assigned U.S. Patent Application Publication No. 2015/0257211, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 9,793,247; 9,159,888; 9,024,349; 8,563,339; 8,337,071; 8,264,138; 8,125,137; 8,044,418; 8,018,135; 7,999,283; 7,960,819; 7,952,544; 7,821,023; 7,802,901; 7,655,957; 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 4,966,862, and/or 4,918,497, and U.S. Patent Application Publication No. 2006/0221272; with the disclosures of the foregoing patents and published patent application being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

In some embodiments the LED devices provided herein can comprise one or more wavelength conversion components, wavelength conversion materials, color conversion components and/or light converting elements. Such wavelength conversion components can comprise any suitable lumiphoric or phosphoric material, such as phosphors P, configured to emit a desired wavelength or light color, such as for example yellow, green, blue, red, and/or white, upon activation or impingement with light emitted by one or more LED chips of solid state light emitters. A wide variety of wavelength conversion materials or luminescent materials, also known as lumiphors or lumiphoric media, are disclosed in U.S. Pat. Nos. 6,600,175 and 8,018,135, each disclosure of which is hereby incorporated by reference herein in the entirety.

Phosphor and phosphor compounds as disclosed herein can comprise one or more of a wide variety of wavelength conversion materials or color conversion components including luminescent materials. Examples of luminescent materials (lumiphors) include phosphors, Cerium-doped Yttrium Aluminum Garnet (YAG), e.g. LuAG:Ce, Nitrides, Oxy-Nitrides, scintillators, day glow tapes, nanophosphors, quantum dots (e.g., such as provided by NNCrystal US Corp. (Fayetteville, Ark.), and inks that glow in the visible spectrum upon illumination with (e.g., ultraviolet) light. Inclusion of lumiphors in wavelength conversion components, or related components as disclosed herein, in conjunction with solid state light emitters and LEDs can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

Wavelength conversion materials, including those incorporated into wavelength conversion components as disclosed herein, can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

As described herein, one or more LED chips can be at least partially covered with a wavelength conversion component comprising one or more phosphors and/or one or more layers of phosphors on a clear substrate, such as for example sapphire. In some embodiments such wavelength conversion components can be referred to as a phosphor-sapphire hat, or Phos hat. Phosphors can be adapted to emit blue light, yellow light, green light, red light, or any combination(s) thereof upon being impinged with light emitted via one or more LED chips. That is, in some aspects one or more phosphors in the Phos hat can absorb a portion of light emitted by the LED chip and in-turn reemit the absorbed light at a different wavelength such that the light emitter device or component emits a combination of light from each of the LED chip(s) and the phosphor(s). In one embodiment, the light emitter devices and components described herein can emit what is perceived as white light resulting from a combination of light emission from the LED chip and the Phos hat. In one embodiment according to the present subject matter, white emitting devices and components can consist of an LED chip that emits light in the blue wavelength spectrum and a phosphor in the Phos hat that absorbs some of the blue light and re-emits light in the green, yellow, and/or red wavelength spectrum. The devices and components can therefore emit a white light combination across the visible spectrum of light. In other embodiments, the LED chips with a wavelength conversion component, e.g. a Phos hat, can emit a non-white light combination of blue and yellow light as described in U.S. Pat. No. 7,213,940. LED chips emitting red light or LED chips covered by a phosphor of a Phos hat that absorbs LED light and emits a red light is also contemplated herein.

Wavelength conversion components or Phos hats used in some embodiments with the disclosed LED components and devices can be made or assembled in any suitable manner. In some embodiments, such wavelength conversion components are produced by applying phosphor only on one surface of the Phos hat so that in assembly of an LED device or component the light affecting material (i.e., heavy scatterer to turn light) is right against or substantially adjacent to the Sapphire or Phos hat substrate, giving a clean edge for meniscus control.

In some embodiments, such wavelength conversion components are produced by spraying a substrate, e.g. LED chip, singulated on tape or other release material in a slightly spaced manner, which can allow for some phosphor to be applied on the sidewall of the substrate to form a Phos hat. This approach can in some aspects be useful where white-$TiO_2$ light affecting material is not used or is applied prior to placing of the Phos hat, which can in some embodiments avoid blue light escaping from sides of a Phos hat.

In some embodiments, substrate wafers can be sprayed, either above room temperature, i.e. hot, or at room temperature, to make the Phos hats. In some aspects it is suitable to spray the wafer at room temperature, followed by curing and then singulating of the die on the wafer.

Other benefits of wavelength conversion materials (e.g., phosphor, P) used in wavelength conversion components as disclosed herein, include, for example, improved far field images (e.g., thereby promoting a very uniform color appearance in the far field with a larger viewing angle), lower color shifts (lower dCCT), improved long term reliability (e.g., improved brightness maintenance (optics) at approximately 1000 hours or more), higher product ratings, cooler phosphor operating temperatures, and/or a lower color point spread, including all or any combination of such features.

Phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths.

Phosphors can in some embodiments be included in an encapsulant used on an LED device. The phosphor can emit radiation in the visible spectrum having lower energy than the radiation emitted by a light emitter and does so in response to the wavelength emitted by the emitter. Combinations of phosphors can be used in conjunction with the blue or UV-emitting chip/LED to create white light; e.g. blue and yellow, blue and green and red, and blue and green and yellow and red. Using three or more colors can provide an opportunity to select a particular white point and a better color rendering. It is also expected that LEDs with more than one emission peak will be useful in exciting one or more phosphors to produce white light.

Phosphors and/or phosphor compounds can be selectively added and/or applied in any desired amount or quantity to clear or substantially clear substrates, wafers or sheets of material. Application of the phosphor and/or phosphor compounds can be achieved via any suitable method including, for example, spraying, gravity sedimentation, centrifugation, addition of a solvent, screen printing, evaporation (sputter, e-beam, thermal, CVD, electrostatic and/or electrophoretic deposition), dipping, spin coating, direct dispensing, and/or vibration, including for example as described in U.S. Pat. No. 8,410,679 to Ibbetson et al., and U.S. Pat. No. 8,425,271 to Hussell et al., the disclosures of which are each hereby incorporated by reference herein in their entireties. In some embodiments the phosphor compound applied to a clear substrate, e.g. sapphire wafer, is conformal to the shape and/or surface of the clear substrate. That is, a conformal layer of phosphor or phosphor compound can, for example, have an at least substantially uniform thickness.

The thickness of phosphor compound and/or phosphor layer on the clear substrate can, for example, range between approximately 2 µm and approximately 100 µm, however, any thickness of phosphor compound on the wavelength conversion component can be provided as desired. The thickness that is used may be selected to reduce or minimize blue light conversion in a planar surface, self-absorption and/or scattering, and may depend on the coating process, the density of the phosphor, other components in the phosphor compound, e.g. silicone, and/or the desired application.

The disclosed wavelength conversion components, for example the Phos hats, can provide advantages over existing color changing elements used with solid state LEDs. For example, in some embodiments the presently disclosed subject matter, and particularly the Phos hats solve or significantly improve the problem of blue light conversion in a planar surface. In some embodiments, coupling the blueTiO$_2$ processing, as discussed herein, with Phos hats can achieve top emitting performance from a bottom emitter die. These advantages are particularly evident as compared to the disadvantages of phosphor in glass (PiGs) and ceramic phosphor plate (CPP), which are widely used but are expensive to make.

More particularly, PiGs are phosphor particles mixed with glass frit, pressed into wafer shapes, fired/sintered in high temperature ovens to become PiG-wafers that are then cut to size. CPP is a single crystal YAG phosphor boule that is grown and that is then wafered and sawn into desired size. As disclosed herein, Phos hats utilize much simpler more readily available technology to achieve similar or improved results.

As disclosed herein, Phos hats can comprise a sapphire wafer which can be sprayed with a phosphor compound, such as a phosphor/silicone mixture, to coat phosphor of the desired colorpoint onto a sapphire wafer/hat. Such Phos hats can in some embodiments have significant advantages, including for example cost, quick turn, very low capital, and sharper corners and flatter surfaces than sintered PiGs. Moreover, there are fewer or no voids or mixing problems as is common with PiGs. Furthermore, there is substantially reduced or no contamination as is common with PiGs. Additionally, PiGs have shrinkage during sintering causing uneven thicknesses and thus uneven color conversion. Also, PiGs are subject to extreme brittleness so therefore are limited to minimum thicknesses for handling. Conversely, Phos hats can be relatively thin (<80 µm) as sapphire wafers are very durable.

As for CPPs, they are inherently expensive to make, such as for example an order of magnitude more expensive.

Another advantage over existing technology is Phos hats are tunable or adjustable. For example, when spraying, or other appropriate application technique as discussed herein, phosphor compounds on a pre-singulated sapphire wafer, this allows the ability to check color within minutes. Post initial spray a Phos hat can be plucked off, tested, and if needed the remaining PhoS wafer can be quick-sprayed to add more phosphor or phosphor compound as needed to tune in the color point.

The disclosed wavelength conversion components, or Phos hats, can comprise a glass or other suitable substrate, i.e. a clear or substantially clear substrate, for light extraction such as sapphire, acrylic, etc. Phos hats can be made on large substrates, including large sapphire wafers, for example, with larger surface areas as compared to exiting options. Moreover, they can be made uniformly across the wide area, thus they can be matched to die wavelengths to achieve tight color control on product. Conversely, PiGs and CPPs are made in much smaller wafer sizes. Because in some embodiments a spray application is used, scattering particles and different phosphors can be mixed together to achieve an array of diffusion and color/CRI points. CPP cannot do this. Moreover, PiGs may not be able to do this as the temperatures required may breakdown some components that would work with Phos hats.

In some embodiments all flip chip die can benefit from the disclosed wavelength conversion components by turning a 3D phosphor emission plane into a 2D emission plane. Additionally, an advantage is that EZ die can be made into "WZ-like" die with this lower cost method.

Robustness of LED devices can also be greatly enhanced with the disclosed components given their hard top or solid upper surface versus a silicone top, which is flexible, in traditional LED devices. Such hard-top or robust LED devices can be useful in applications requiring such strength, including for example automotive applications. Moreover, sulfur resistance can in some embodiments be greatly enhanced over silicone encapsulated components.

Various illustrative features are described below in connection with the accompanying figures.

Figure 1B:
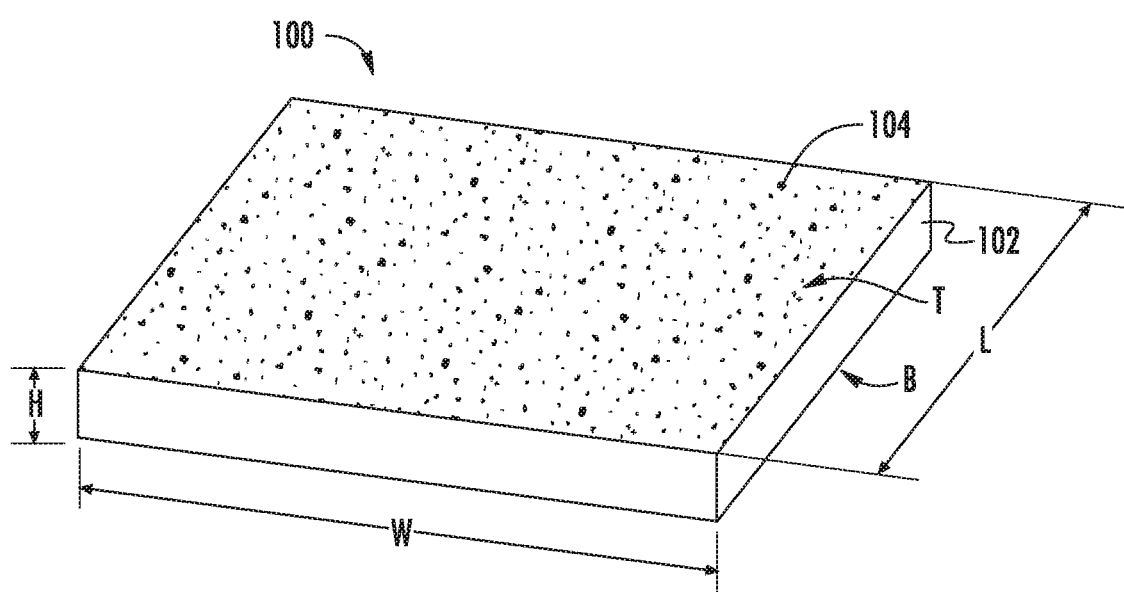
Figure 1C:
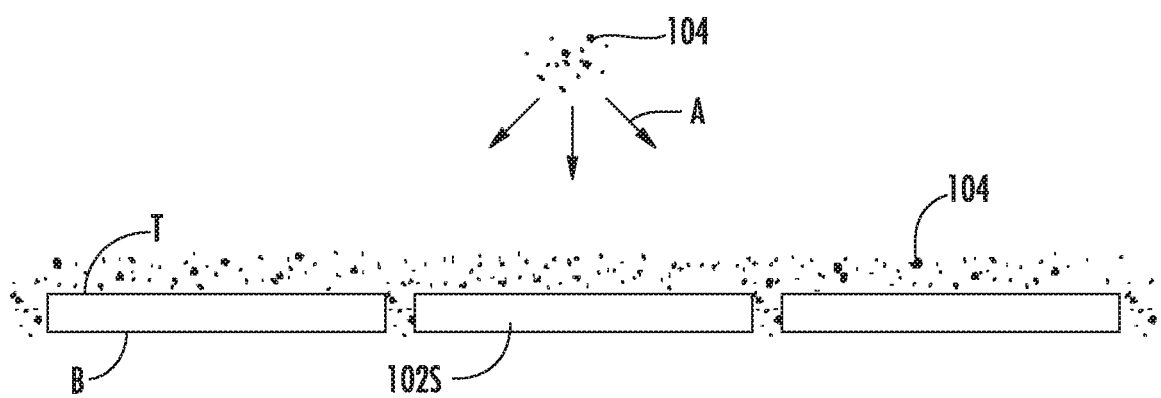

FIGS. 1A through 1C are various illustrations of example wavelength conversion components 100, also referred to as a color conversion components and/or light converting element. In some embodiments, particularly when comprised of phosphor on sapphire, such components can be referred to herein as Phos hats. FIG. 1A is a side view illustration of a wavelength conversion components 100 comprising a clear substrate 102, or transparent substrate, and a phosphor compound 104 applied thereto. Phospor compound 104 can be applied to a top T or upper surface of clear substrate 102, as illustrated in FIG. 1A, or can be applied to a bottom B or lower surface of clear substrate 102, or in some embodiments on both top T and bottom B. As illustrated in FIG. 1B, wavelength conversion components 100 can comprise a substantially planar or wafer structure comprising a clear substrate 102 with a phosphor compound 104 applied to a surface thereof, such as for example top surface T.

Clear substrate 102 can in some embodiments comprise a sapphire wafer, or other suitable clear or transparent material, such as for example glass of any kind, acrylic, soda lime, borosilicate, quartz/SiO$_2$, MgF$_2$. In some embodiments clear substrate 102 can comprise a rigid or flexible clear substrate as well as a clear cure silicone sheet, which can provide the ability to shape a phosphor layer. Phosphor sheets can comprise phosphor mixed into a silicone matrix and squeegeed flat and frozen to be used to lay onto a panel populated with die. Such a configuration can provide a flexible Phos hat where the substrate can comprise for example a soft methyl. Such a configuration can in some embodiments be vacuum attached and the soft silicone could conform and seal to a wet attach layer.

In some embodiments the phosphor compound 104 can comprise phosphor, and/or a mixture of phosphor and another material, such as for example silicone, silicon (fumed silica), fused silica, TiO$_2$, and other generic diffusers. Any scatterer, e.g. fused silica, can be added to the mixture for packing and homogeneity of emission. TiO$_2$ in small concentrations can in some embodiments be used effectively. In some embodiments the mixture of phosphor and silicone comprises a ratio of about 1:1 to about 6:1, including about 1:1, about 2.5:1, about 3:1, about 4:1. about 4.5:1 and/or about 5:1. In some aspects the concentration and/or particle size of the phosphor in the phosphor compound is adjustable, wherein the concentration and/or particle size of the phosphor alters a color produced by a wavelength passing through the wavelength conversion component.

Application A of the phosphor and/or phosphor compounds 104 to clear substrate 102 can be achieved via any suitable method including, for example, spraying, gravity sedimentation, centrifuge, addition of a solvent, screen printing, evaporation (sputter, e-beam, thermal, CVD, electrostatic and/or electrophoretic deposition), dipping, spin coating, direct dispensing, and/or vibration, as discussed further herein. In some aspects, the phosphor compound 104 is substantially uniformly applied to the transparent substrate 102 and/or is conformal to the transparent substrate 102.

Wavelength conversion component 100 as shown in FIGS. 1A through 1C is configured to alter a wavelength of a light emitted from a light source when positioned proximate to the light source, such as for example a LED. Thus, as discussed further herein, component 100 is configured to be positioned on or proximate to a light source, such as an LED. In some embodiments, and as shown in FIG. 1B, wavelength conversion component 100 can comprise any suitable size or configuration as needed for application to, on or near a light source such as an LED. For example, width W, length L and height H can be configured as desired, e.g. 40 um to 10 mm long and 5 um to 10 mm wide, or more, to achieve a wavelength conversion component 100 having an area of about 200 um$^2$ to about 5 mm$^2$. In some embodiments a wavelength conversion component 100 can be about 50 mm$^2$ or more. By way of example and not limitation, a wavelength conversion component can be any desirable size and/or shape, such as about 30×30 mm, which is an advantage not available in PiGs and CPPs.

As illustrated in FIG. 1A, in some embodiments phosphor compound 104 can be applied A to substrate 102 and then the wafer can be cut C into desired dimensions. Alternatively, as illustrated in FIG. 1C, substrate 102 can in some embodiments be cut or singulated into clear substrates 102S prior to application A of phosphor compound 104. In the approach depicted in FIG. 1C phosphor compound 104 can in some embodiments be applied to top surface T as well as along some edges or sides of clear substrate 102.

In some embodiments wavelength conversion components, or Phos hats, can be made by providing a transparent substrate having an upper surface and a lower surface, applying a phosphor compound to the upper surface and/or lower surface of the transparent substrate, and curing the transparent substrate with applied phosphor compound. The resulting wavelength conversion component can in some embodiments be configured to alter a wavelength of a light emitted from a light source when positioned proximate to the light source. The transparent substrate can comprise a sapphire wafer, and the phosphor compound can comprise a mixture of phosphor and silicone.

In some embodiments making the disclosed wavelength conversion components, or Phos hats, can further comprise using a stealth laser to cause an internal damage layer in the transparent substrate. Is some embodiments using the stealth laser to pitch can occur prior to application of the phosphor compound.

Application of the phosphor and/or phosphor compounds to the clear or transparent substrate can be achieved via any suitable method including, for example, spraying, gravity sedimentation, centrifuge, addition of a solvent, screen printing, evaporation (sputter, e-beam, thermal, CVD, electrostatic and/or electrophoretic deposition), dipping, spin coating, direct dispensing, and/or vibration. The phosphor compound can be substantially uniformly applied to the transparent substrate such that it is conformal to the transparent substrate.

In some embodiments, a silicone compound and/or layer can be applied on the phosphor compound that is applied to the upper surface and/or lower surface of the transparent substrate.

Figure 2A:
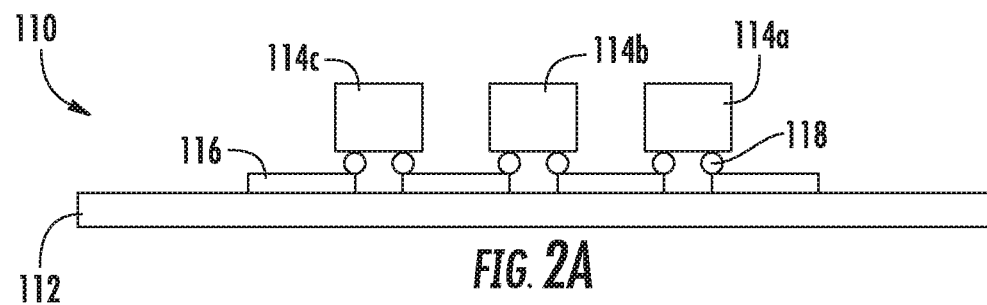
FIGS. 2A through 2E are various illustrations of example LED devices.

FIGS. 2A through 2E are various illustrations of example LED devices as provided herein. In some embodiments FIGS. 2A through 2E can be viewed as steps for making/assembling a LED device as provided herein, although variations in the order of the steps and omission/addition of some steps is not precluded. FIG. 2A depicts a light emitter device 110 comprising a submount 112 and one or more light emitters 114a, 114b, and 114c disposed on submount 112. Any number of light emitters 114a-c, or LEDs, can be disposed on or applied to submount 112. Additionally, LEDs 114a-c can each have a different targeted color. Although three LEDs are illustrated, device 110 can include a different number of LEDs, e.g., one or more LEDs.

In some embodiments a submount 112, or substrate, can comprise electronic traces 116, or conductive traces, but in some examples, device 110 could be based on a leadframe construction where no traces are on top, or any other appropriate construction. In some embodiments die attach material 118, or solder bumps, can be provided to create an electrical contact between light emitters 114a-c and electronic traces 116.

In some embodiments FIG. 2A depicts a light emitter device 110 comprising a submount 112 comprising an upper surface and a bottom surface and one or more light emitters 114a-c disposed on the upper surface of submount 112. In some embodiments the one or more light emitters 114a-c each comprise an upper surface, a lower surface adjacent to the upper surface of submount 112, and one or more sides.

Figure 2B:
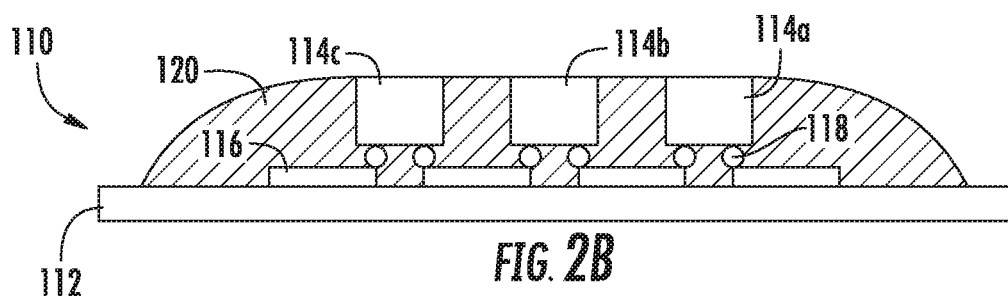

Turning to FIG. 2B, a light affecting material 120 can be applied to device 110. In some embodiments light affecting material 120 can comprise a reflective material, such as for example TiO$_2$ (also referred to as titania and/or blue TiO$_2$), Al$_2$O$_3$, Boron nitride, microcellular polyethylene terephthalate (McPET) and/or Barium sulfate (sphere material). In some embodiments light affecting material 120 is applied to device 110 so at to surround the one or more light emitters 114a-c disposed on submount 112. That is, in some embodiments light affecting material 120 can be disposed on the upper surface of submount 112 and/or adjacent to the one or more sides of the one or more light emitters 114a-c. In some embodiments light affecting material 120 is applied at a depth or height substantially similar to a height of light emitters 114a-c such that each side of light emitters 114a-c are surrounded by light affecting material 120 on one or more sides of light emitters 114a-c Light emitters 114a-c can comprise any suitable chip size, shape, and/or thickness. In some aspects, the thickness or height can be approximately 0.25 mm or more, 0.3 mm or more, 0.4 mm or more, or 0.5 mm or more. By applying the reflective or light affecting material on the sides of the LEDs light emitted from the sides of the LEDs can minimized thereby focusing the light emission from an upper surface of the LEDs. In some embodiments light affecting material 120 surrounds light emitters 114a-c and fills any voids or filets there between, as depicted in FIG. 2B.

Figure 2C:
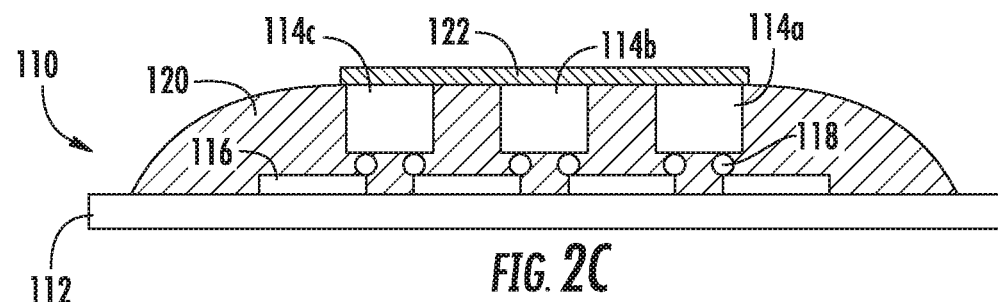

FIG. 2C depicts light emitter device 110 with a clear layer 122 applied to light emitters 114a-c. Particularly, in some embodiments a clear layer 122, in some embodiments comprising a silicone and/or an adhesive, and optionally a scatter compound, can be applied to an upper surface of one or more of light emitters 114a-c. Clear or silicone layer 122 can in some embodiments be configured to adhere the wavelength conversion component (see FIG. 2D) to the upper surface of the one or more light emitters 114a-c. The scatter compound can comprise fumed silica, fused silica, and/or $TiO_2$. In some aspects, $TiO_2$ in small percentages can be used for the scattering compound. For example, the percentage of $TiO_2$ can be from around, about or approximately 0.1% to 5.0%. In some aspects, the percentage of $TiO_2$ can for example be around, about or approximately 1%. Clear or silicone layer 122 can be applied to the LEDs such that it substantially or completely covers the upper surface thereof. In some embodiments the clear layer can be administered such that it extends to the edges of the upper surface of the one or more LEDs on the device, without extending past the edges.

Figure 2D:
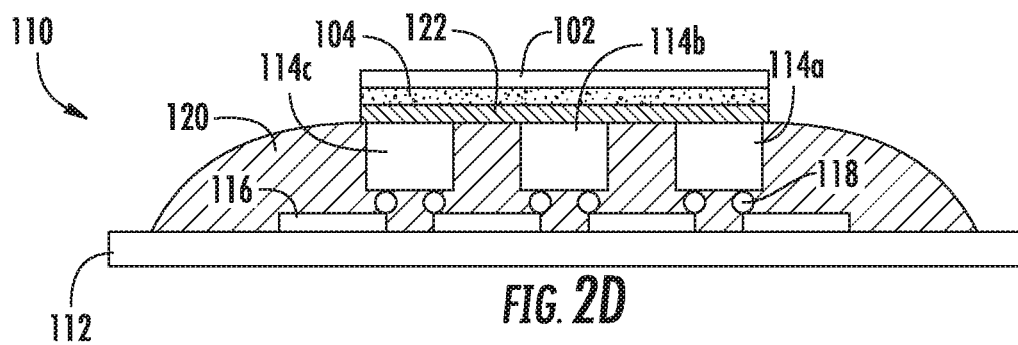

As depicted in FIG. 2D, the wavelength conversion component, or Phos hat, can be applied to device 110 by placing the clear substrate 102 with phosphor layer 104 directly above light emitters 114a-c. By disposing wavelength conversion component on the upper surface of the one or more light emitters the Phos hat can affect the light output from the LEDs, including improving the uniformity of color produced by device 110. In some embodiments, the Phos hat can be applied with the phosphor 104 side down as depicted in FIG. 2D. Clear layer 122 can in some embodiments act as an adhesive to adhere substrate 102 with phosphor layer 104 onto light emitters 114a-c.

Figure 2E:
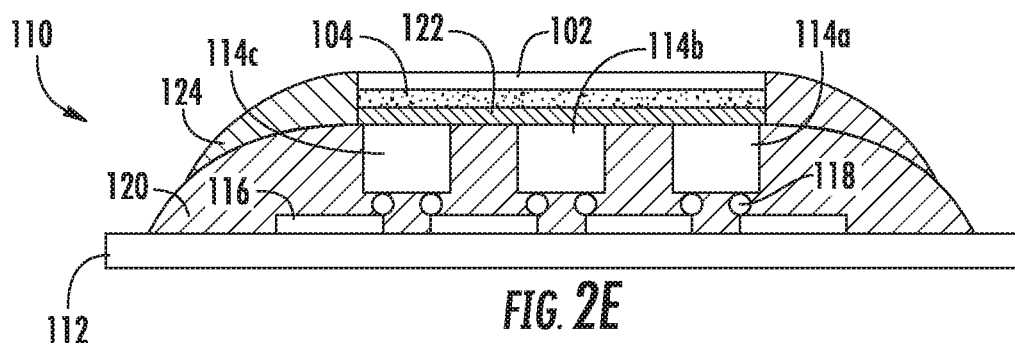

In FIG. 2E a second application of light affecting material 124 can be applied to device 110. In some embodiments light affecting material 124 can comprise a reflective material, such as for example $TiO_2$ (also referred to as titania and/or blue $TiO_2$), and can be the same as light affecting material 120. In some embodiments light affecting material 124 is applied to device 110 so at to surround the Phos hat (substrate 102 and phosphor layer 104) on top of LEDs 114a-c. That is, in some embodiments light affecting material 124 can be disposed on previously applied light affecting material 120 and adjacent to the one or more sides of the Phos hat (substrate 102 and phosphor layer 104) on top of LEDs 114a-c. In some embodiments light affecting material 124 is applied at a depth or height substantially similar to a height the Phos hat such that each side of it is surrounded by light affecting material 124. By applying the reflective or light affecting material on the sides of the Phos hat light emitted from the sides of the LEDs and the Phos hat on top thereof can be minimized thereby focusing the light emission from an upper surface of the LEDs and Phos hat.

In some embodiments device 110, including that depicted in FIG. 2E, can be cured at an appropriate temperature, such as for example 150° C.

Figure 3A:
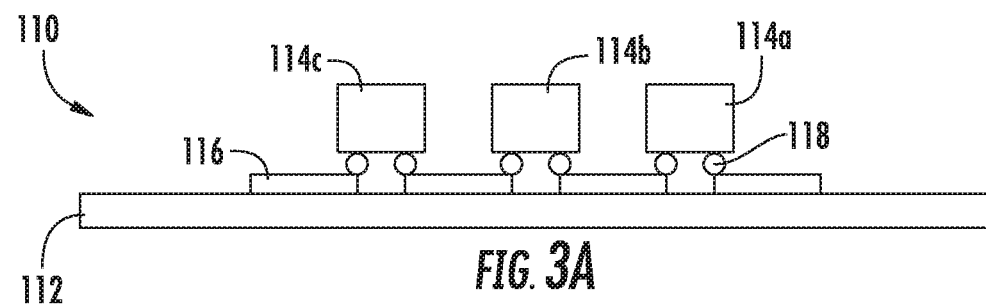
FIGS. 3A through 3D are various illustrations of example LED devices.

Turning now to FIGS. 3A through 3D, various examples of LED devices as provided herein are illustrated. In some embodiments FIGS. 3A through 3D can be viewed as steps for making/assembling a LED device as provided herein, although variations in the order of the steps and omission/addition of some steps is not precluded. FIG. 3A depicts a light emitter device 110 comprising a submount 112 and one or more light emitters 114a, 114b, and 114c disposed on submount 112. Any number of light emitters 114a-c, or LEDs, can be disposed on or applied to submount 112. Additionally, LEDs 114a-c can each have a different targeted color. Although three LEDs are illustrated, device 110 can include a different number of LEDs, e.g., one or more LEDs.

In some embodiments a submount 112, or substrate, can comprise electronic traces 116, or conductive traces, but in some examples, device 110 could be based on a leadframe construction where no traces are on top, or any other appropriate construction. In some embodiments die attach material 118, or solder bumps, can be provided to create an electrical contact between light emitters 114a-c and electronic traces 116.

In some embodiments FIG. 3A depicts a light emitter device 110 comprising a submount 112 comprising an upper surface and a bottom surface and one or more light emitters 114a-c disposed on the upper surface of submount 112. In some embodiments the one or more light emitters 114a-c each comprise an upper surface, a lower surface adjacent to the upper surface of submount 112, and one or more sides.

Figure 3B:
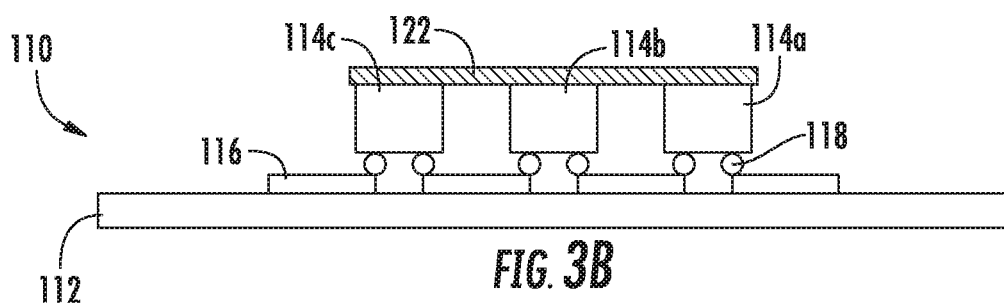

FIG. 3B depicts light emitter device 110 with a clear layer 122 applied to light emitters 114a-c. Particularly, in some embodiments a clear layer 122, in some embodiments comprising a silicone and/or an adhesive, and optionally a scatter compound, can be applied to an upper surface of one or more of light emitters 114a-c. Clear or silicone layer 122 can in some embodiments be configured to adhere the wavelength conversion component (see FIG. 3C) to the upper surface of the one or more light emitters 114a-c. The scatter compound can comprise fumed and/or fused silica. Clear or silicone layer 122 can be applied to the LEDs such that it substantially or completely covers the upper surface thereof. In some embodiments the clear layer can be administered such that it extends to the edges of the upper surface of the one or more LEDs on the device, without extending past the edges.

Figure 3C:
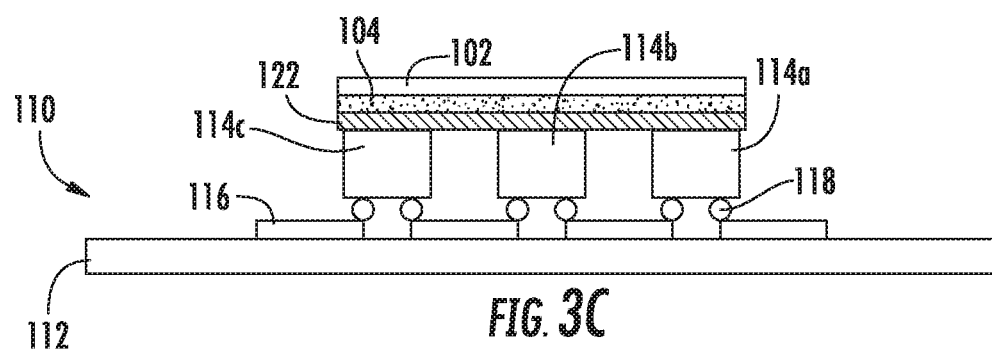

As depicted in FIG. 3C, the wavelength conversion component, or Phos hat, can be applied to device 110 by placing the clear substrate 102 with phosphor layer 104 directly above light emitters 114a-c. By disposing wavelength conversion component on the upper surface of the one or more light emitters the Phos hat can affect the light output from the LEDs, including improving the uniformity of color produced by device 110. In some embodiments, the Phos hat can be applied with the phosphor 104 side down as depicted in FIG. 3C. Clear layer 122 can in some embodiments act as an adhesive to adhere substrate 102 with phosphor layer 104 onto light emitters 114a-c.

Figure 3D:
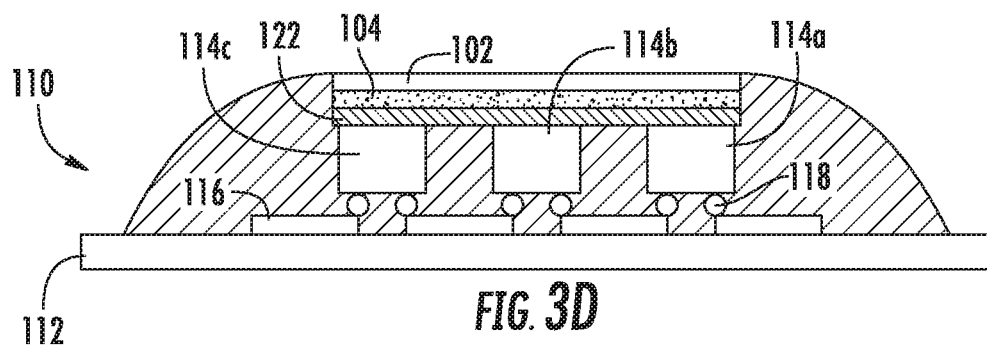

Turning to FIG. 3D, a light affecting material 120 can be applied to device 110. In some embodiments light affecting material 120 can comprise a reflective material, such as for example $TiO_2$. In some embodiments light affecting material 120 is applied to device 110 so at to surround the one or more light emitters 114a-c disposed on submount 112, as well as the Phos hat (substrate 102 and phosphor layer 104) on top of LEDs 114a-c. That is, in some embodiments light affecting material 120 can be disposed on the upper surface of submount 112 and/or adjacent to the one or more sides of the one or more light emitters 114a-c. In some embodiments light affecting material 120 is applied at a depth or height substantially similar to a height of light emitters 114a-c, including the height of the Phos hat (substrate 102 and phosphor layer 104) on top of LEDs 114a-c, such that each side of light emitters 114a-c is surrounded by light affecting material 120. By applying the reflective or light affecting material on the sides of the LEDs light emitted from the sides of the LEDs can minimized thereby focusing the light emission from an upper surface of the LEDs and Phos hat.

Figure 4A:
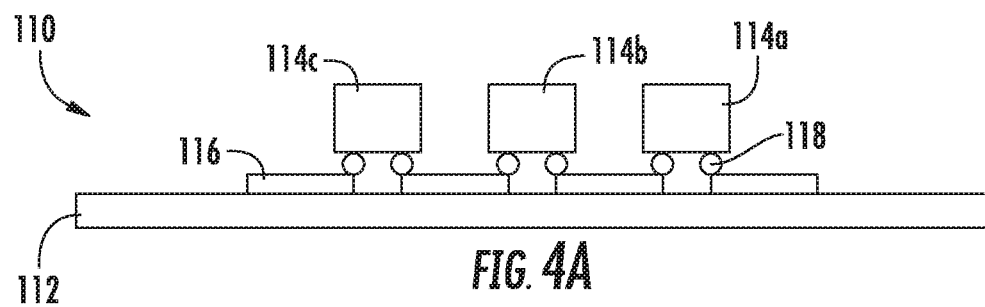
FIGS. 4A through 4D are various illustrations of example LED devices.

Turning now to FIGS. 4A through 4D, various examples of LED devices as provided herein are illustrated. In some embodiments FIGS. 4A through 4D can be viewed as steps for making/assembling a LED device as provided herein, although variations in the order of the steps and omission/addition of some steps is not precluded. FIG. 4A depicts a light emitter device 110 comprising a submount 112 and one or more light emitters 114a, 114b, and 114c disposed on submount 112. Any number of light emitters 114a-c, or LEDs, can be disposed on or applied to submount 112. Additionally, LEDs 114a-c can each have a different targeted color. Although three LEDs are illustrated, device 110 can include a different number of LEDs, e.g., one or more LEDs.

In some embodiments a submount 112, or substrate, can comprise electronic traces 116, or conductive traces, but in some examples, device 110 could be based on a leadframe construction where no traces are on top, or any other appropriate construction. In some embodiments die attach material 118, or solder bumps, can be provided to create an electrical contact between light emitters 114a-c and electronic traces 116.

In some embodiments FIG. 4A depicts a light emitter device 110 comprising a submount 112 comprising an upper surface and a bottom surface and one or more light emitters 114a-c disposed on the upper surface of submount 112. In some embodiments the one or more light emitters 114a-c each comprise an upper surface, a lower surface adjacent to the upper surface of submount 112, and one or more sides.

Figure 4B:
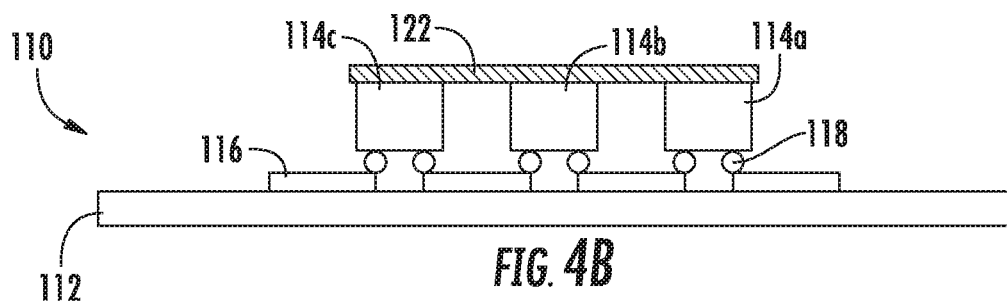

FIG. 4B depicts light emitter device 110 with a clear layer 122 applied to light emitters 114a-c. Particularly, in some embodiments a clear layer 122, in some embodiments comprising a silicone and/or an adhesive, and optionally a scatter compound, can be applied to an upper surface of one or more of light emitters 114a-c. Clear or silicone layer 122 can in some embodiments be configured to adhere the wavelength conversion component (see FIG. 4C) to the upper surface of the one or more light emitters 114a-c. The scatter compound can comprise fumed and/or fused silica. Clear or silicone layer 122 can be applied to the LEDs such that it substantially or completely covers the upper surface thereof. In some embodiments the clear layer can be administered such that it extends to the edges of the upper surface of the one or more LEDs on the device, without extending past the edges.

Figure 4C:
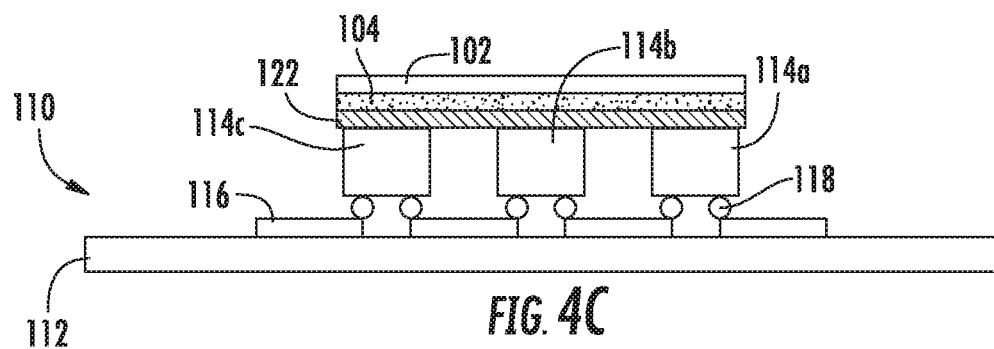

As depicted in FIG. 4C, the wavelength conversion component, or Phos hat, can be applied to device 110 by placing the clear substrate 102 with phosphor layer 104 directly above light emitters 114a-c. By disposing wavelength conversion component on the upper surface of the one or more light emitters the Phos hat can affect the light output from the LEDs, including improving the uniformity of color produced by device 110. In some embodiments, the Phos hat can be applied with the phosphor 104 side down as depicted in FIG. 4C. Clear layer 122 can in some embodiments act as an adhesive to adhere substrate 102 with phosphor layer 104 onto light emitters 114a-c.

Figure 4D:
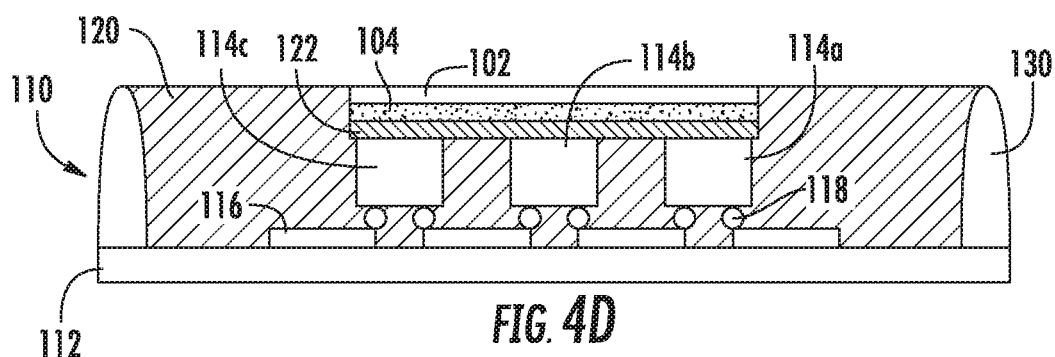

Turning to FIG. 4D, a light affecting material 120 can be applied to device 110. In some embodiments light affecting material 120 can comprise a reflective material, such as for example $TiO_2$. In some embodiments light affecting material 120 is applied to device 110 so at to surround the one or more light emitters 114a-c disposed on submount 112, as well as the Phos hat (substrate 102 and phosphor layer 104) on top of LEDs 114a-c. That is, in some embodiments light affecting material 120 can be disposed on the upper surface of submount 112 and/or adjacent to the one or more sides of the one or more light emitters 114a-c. In some embodiments light affecting material 120 is applied at a depth or height substantially similar to a height of light emitters 114a-c, including the height of the Phos hat (substrate 102 and phosphor layer 104) on top of LEDs 114a-c, such that each side of light emitters 114a-c is surrounded by light affecting material 120. In order to contain light affecting material 120 on the upper surface of the submount and/or adjacent to the one or more sides of the one or more light emitters a dam material 130 can be provided/applied by any suitable technique, e.g. molded, dispensed, etc., around a periphery of submount 112. Dam material 130 can be configured to contain light affecting material 120 on the upper surface of submount 112 and/or adjacent to the one or more sides of the one or more light emitters 114a-c whereby the one or more light emitters is surrounded by the light affecting material. In some embodiments, and as depicted in FIG. 4D, dam material 130 can in some embodiments be configured to extend above the upper surface of submount 112 to a height substantially similar to a height of the one or more sides of the one or more light emitters 114a-c, such that dam material 130 is configured to contain enough light affecting material 120 to surround the one or more light emitters 114a-c at a depth substantially similar to the height of the one or more sides of the one or more light emitters 114a-c. In some embodiments dam material 130 can be more viscous than light affecting material 120. In some embodiments, an upper surface of the light affecting material 120 encapsulating the one or more light emitters 114a-c is substantially planar to the upper surface of the one or more light emitters. That is, in the configuration depicted in FIG. 4D the light affecting material 120 can be applied in such a manner as to create a squared off or substantially squared profile with an upper surface substantially planar to the upper surface of the LEDs/Phos hat, with an outer edge that is substantially vertical. In some embodiments dam material 130 can be removed after application, and in some embodiments, curing of light affecting material 120. By applying the reflective or light affecting material on the sides of the LEDs light emitted from the sides of the LEDs can minimized thereby focusing the light emission from an upper surface of the LEDs and Phos hat. Such effect can be further enhanced and/or optimized in some embodiments by providing the light affecting/reflective material in a squared-off configuration as depicted in FIG. 4D.

In some embodiments dam material 130 can be configured as a high angle light reflector, such as for when light affecting material 120, or fill material, is clear. Dam material 130 can serve as a reflector of high angle light to make light more useful for application intent, especially when light affecting material 120 is a substantially transparent fill material. In some embodiments molded domes can be coupled with dam material 130 for light reflection to increase brightness, i.e. useful light. Such a configuration can be used with or without a wavelength conversion component or Phos hat as described herein.

Dam material 130 can in some embodiments comprise a mix of $Si_5$ with 50% $TiO_2$, 50% 705F fused silica (roughly phosphor sized glass beads), and 5% A604 fumed silica. In some embodiments dam material 130 can comprise a mix of $Si_4$, OE6370 silicone, 75% $TiO_2$, 50% fused silica, and 7.5% fumed Silica.

FIG. 5 is a perspective view of an example LED device 140, or LED chip, as disclosed herein. LED device 140 can in some embodiments be the final product of the examples and steps depicted in FIGS. 2A-2E, 3A-3D and/or 4A-4D. LED device 140 can in some embodiments comprise a submount 112 and one or more light emitters 114a, 114b, and 114c disposed on submount 112. Wavelength conversion component 100 (or Phos hat comprising substrate 102 and phosphor layer 104 as depicted in FIGS. 2D, 3C and 4C) can be disposed directly above LEDs 114a-c. Light emitters 114a, 114b, and 114c and wavelength conversion component 100 can be surrounded by light affecting material 120. One or more contacts 128 can be provided on substrate 112, and in some embodiments can extend under LEDs 114a-c and/or can be in electrical connection to electronic traces 116 (see FIGS. 2A, 3A and/or 4A) to provide electrical connections to LEDs 114a-c. Contacts 128 can comprise one cathode and one anode. In some embodiments, LED device 140 can comprise a quick response code QR, or other bar code configured to contain information about the device.

FIGS. 6A and 6B are top plan views of example LED devices 170 and 172, respectively. LED devices 170 and 172 can in some embodiments comprise one light emitter 114 as depicted in FIG. 6A, or one or more light emitters, such as for example two light emitters 114a/114b as depicted in FIG. 6B, or more. A wavelength conversion component, or Phos hat, as disclosed herein can be disposed over the one or more light emitters. Light emitters 114 or 114a/114b and the wavelength conversion component can be surrounded by light affecting material 120.

FIG. 6C depicts a bottom plan view of an example LED device 170/172. In some embodiments the light emitters, such as light emitters 114 in FIG. 6A, can be arranged for mounting using surface mount technology and having internal conductive paths, comprising first and second surface mount pads 176a and 176b, respectively, that can be formed on back surface 174 of submount 112. Conductive vias 178 can be formed through submount 112 such that when a signal is applied to one or both of first and second surface mount pads 176a and 176b it is conducted to one or more electronic traces on the top surface of submount 112, such as electronic traces 116 depicted in FIGS. 2A, 3A and/or 4A. In some embodiments, first and second mounting pads 176a and 176b can allow for surface mounting of the LED devices 170/172 with the electrical signal to be applied to the LED devices 170/172 applied across the first and second mounting pads 176a and 176b.

It is understood that the mounting pads 176a and 176b, and vias 178 can be arranged in many different ways and can have many different shapes and sizes. It is also understood that instead of vias, one or more conductive traces can be provided on the surface of the submount between the mounting pads and contact pads, such as along the side surface of the submount.

The LED device 170/172 can further comprise a metallized area 180 on the back surface 174 of submount 112, between the first and second mounting pads 176a and 176b, respectively. Metallized area 180 is preferably made of a heat conductive material and is preferably in at least partial vertical alignment the one or more LEDs 114 (FIG. 6A) or 114a, 114b (FIG. 6B). In one embodiment, the metallized area 180 is not in electrical contact with the elements on top surface of the submount 112 or the first and second mounting pads 176a and 176b on the back surface 174 of the submount 112. Although heat from the LED is laterally spread over the top surface of the submount more heat will pass into the submount directly below and around the LED. The metallized area can assist with this dissipation by allowing this heat to spread into the metallized area where it can dissipate more readily. It is also noted that the heat can conduct from the top surface of the submount 112, through the vias 178, where the heat can spread into the first and second mounting pads 176a and 176b where it can also dissipate. For the LED device 170/172 used in surface mounting, the thickness of the metallized area 180 and the first and second pads 176a and 176b should be approximately the same such that all three make contact to a lateral surface such as a PCB.

FIG. 6D is a side view of LED device 170/172, and illustrating an optical area, including light affecting material 120 near an upper surface, mounted on submount 112, with one or more copper traces 212 (or other conductive material such as Ni, Pd or Au) thereunder.

Figure 6E:
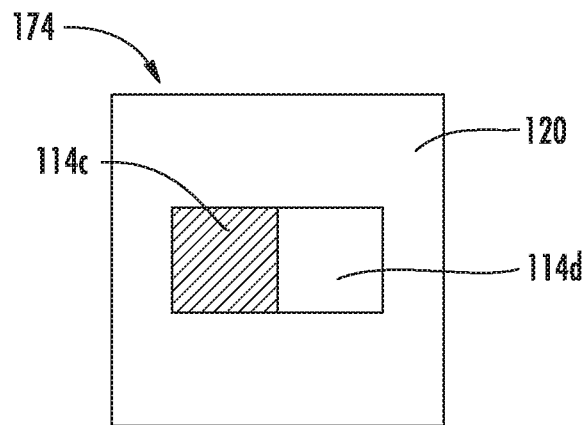

FIG. 6E is a top plan view of an example LED device 174. LED device 174 can in some embodiments comprise one or more light emitters 114c and 114d, as depicted in FIG. 6E. A wavelength conversion component, or Phos hat, as disclosed herein can be disposed over the one or more light emitters. Light emitters 114c/114d and the wavelength conversion component can be surrounded by light affecting material 120. As shown in FIG. 6E, in some embodiments different phosphor regions, areas or zones can be disposed over emitters 114c/114d. Any combinations of phosphors and colors are possible, including for example a red phosphor region or zone over emitter 114c, and a separate yellow and/or green phosphor region or zone over emitter 114d. Emitters 114c/114d, can be any desired color, such as for example both emitters 114c/114d can comprise blue LEDs. The color emitted by the emitter or LED can be color shifted for example by the phosphor region or zone. U.S. Pat. No. 8,998,444, incorporated herein by reference and commonly owned herewith, discloses blue-shifted yellow and/or green plus (+) blue-shifted red.

In some embodiments two or more zones can be helpful where the emission spectrum of one phosphor overlaps with the activation (or excitation) spectrum of another phosphor. In some embodiments, phosphors and phosphor colors can be layered on each other and on a wavelength conversion component disposed over an emitter to produced different colors and/or color intensities. For example, phosphors can be optimally layered in one or more layers to achieve a light effect or desired wavelength. See, e.g., U.S. Patent Application Publication No. 2009/0039375, incorporated herein by reference and commonly owned herewith. For example, a first layer can comprise a red phosphor and a second layer a yellow phosphor, or vice versa. Additionally, a green phosphor can be layered on a yellow phosphor that is layered on a red phosphor, for example. Moreover, emitters, such as emitters 114c/114d in FIG. 6E, with different phosphor colors thereon can be separately controllable such that they can be turned on at the same time or at different times.

Figure 7:
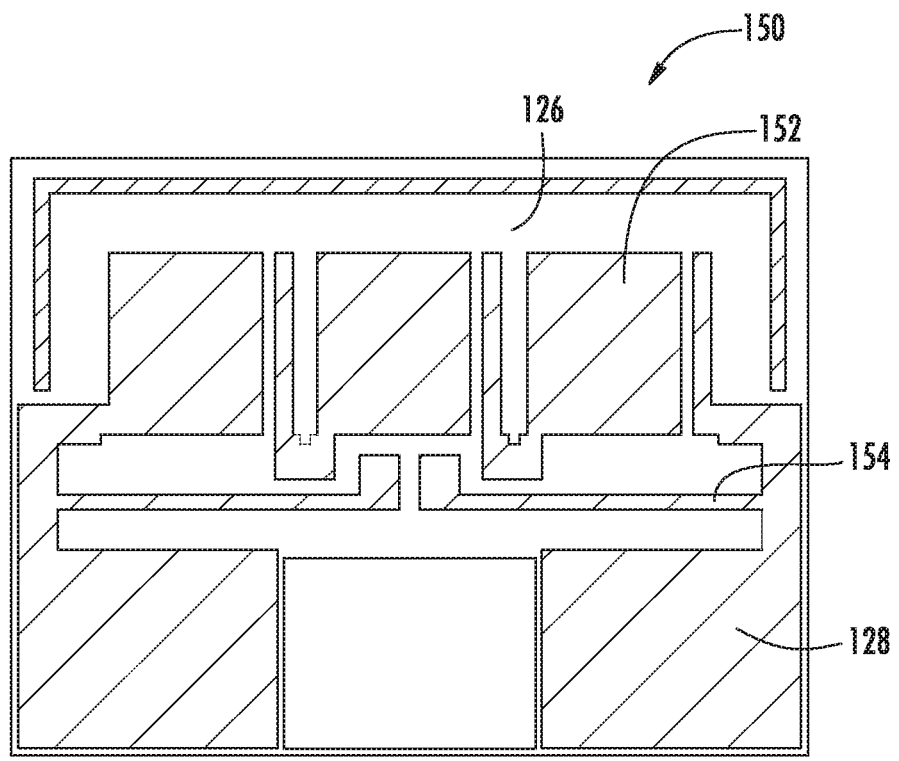
FIG. 7 is a plan view illustrating traces of an LED device.

FIG. 7 is a plan view illustrating a metal trace configuration of an example LED device 150. In some embodiments the metalized trace depicted in FIG. 6 can comprise a metalized trace corresponding to LED device 140 of FIG. 5. LED device 150 can comprise a substrate 126 (in some embodiments similar to substrate 112 of FIG. 5) and one or more contacts 128, including one cathode and one anode. Connected to contacts 128 can be one or more electronic traces 154 and/or contact pads 152, which can be configured to allow electric current to flow into and out of the solid state light emitters thereby illuminating the solid state light emitters. Solid state light emitters can be electrically connected only in parallel, only in series, or in an arrangement comprising a combination of parallel and series.

Figure 8A:
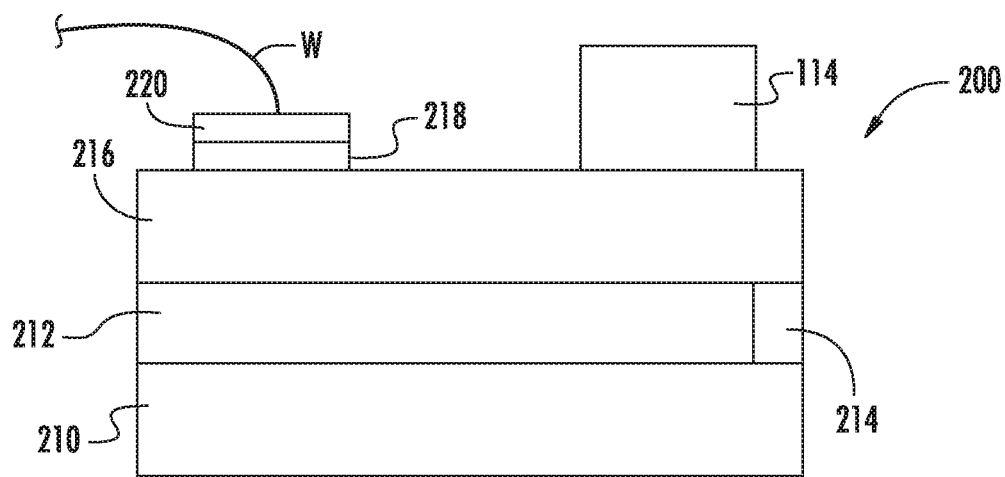
FIGS. 8A and 8B are various illustrations of example LED components.
Figure 8B:
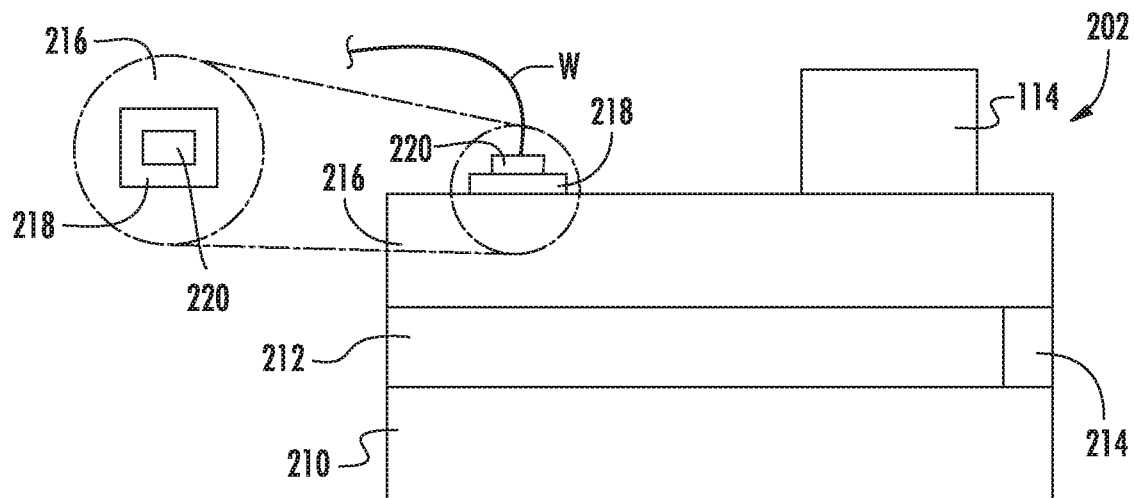

FIGS. 8A and 8B are various illustrations of example LED components 200 and 202, respectively. Each of components 200 and 202 can in some embodiments comprise a substrate 210, such as an aluminum nitride substrate, and one or more copper traces 212 on substrate 210. A gold interface 216 can be disposed on and/or above one or more copper traces 212. An aluminum pad 220 configured for wire bonding W an LED can be disposed on a portion of gold interface 216, with a layer of titanium 218 between aluminum pad 220 and gold interface 216. The layer of titanium 218 can be configured to substantially prevent, or significantly reduce, galvanic action between aluminum pad 220 and gold interface 216. A light emitter 114 can be disposed on gold interface 216.

In FIG. 8A the layer of titanium 218 and aluminum pad 220 can be substantially aligned vertically such that titanium 218 is substantially and directly below aluminum pad 220. Alternatively, in FIG. 8B aluminum pad 220 can be disposed on top of a layer of titanium 218 that extends past the edges of aluminum pad 220. As such, titanium 218 is configured to extend beyond an outer periphery of aluminum pad 220 and provide an additional insulting effect against galvanic action between the aluminum pad and gold interface. As depicted in the inset of FIG. 8B, showing a top plan view of titanium 218 and aluminum pad 220, titanium 218 is configured to extend beyond an outer periphery of aluminum pad 220. A light emitter 114 can for example be disposed on gold interface 216, and a wire W for wire bonding can for example extend from aluminum pad 220 for connecting to other structure.

In some embodiments provided herein are methods of making a LED component such as those depicted in FIGS. 8A and 8B. Such methods can comprise providing an aluminum nitride substrate, providing one or more copper traces on the aluminum nitride substrate, providing a gold interface on the one or more copper traces, applying a first photo mask to create an opening on the gold interface and applying a layer of titanium thereon, and applying a second photo mask to create an opening on the layer of titanium and applying an aluminum pad configured for wire bonding the LED. Such a method provides an LED component as depicted in FIG. 8B having a layer of titanium between the aluminum pad and gold interface, wherein the layer of titanium is configured to substantially prevent galvanic action between the aluminum pad and gold interface.

Figure 9:
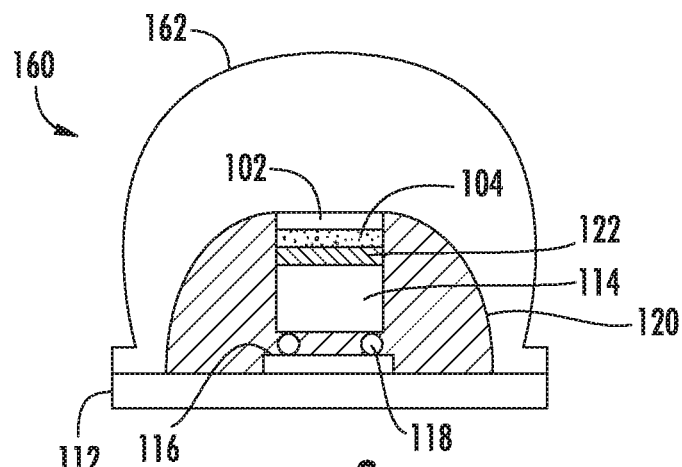
FIG. 9 is an illustration of an example LED device.

FIG. 9 is an illustration of an example LED device 160. FIG. 9 depicts an LED device, such as that depicted in any of FIGS. 2A-2E, 3A-3D, 4A-4D and/or 5, enclosed in a lens 162. LED device 160 can comprise a submount 112 and one or more light emitters 114 disposed on submount 112. Any number of light emitters 114 or LEDs can be disposed on or applied to submount 112. In some embodiments a submount 112, or substrate, can comprise electronic traces 116, or conductive traces, but in some examples, device 110 could be based on a leadframe construction where no traces are on top, or any other appropriate construction. In some embodiments die attach material 118, or solder bumps, can be provided to create an electrical contact between light emitters 114 and electronic traces 116. In some embodiments a clear layer 122, such as silicone, can be applied to light emitters 114 on top of which a wavelength conversion component (Phos hat), comprising clear substrate 102 with phosphor layer 104 directly, can be applied. Finally, as discussed herein, a light affecting material 120 can be applied to device 110 so at to surround the one or more light emitters 114. A lens 162 can be adhered to or otherwise affixed to substrate 112 and enclose light emitter 114, wavelength conversion component 102/04, and light affecting material 120. Lens 162 can provide a protective element to the LED and related components, and/or alter light emitted therefrom.

In some examples, LEDs used in the devices and components herein can have different targeted colors selected so that devices can operate as a pixel and produce a range of colors within its color gamut by energizing different combinations of LEDs. For example, LEDs can include UV, blue or green LED chips, such as a group III nitride based LED chip comprising negatively doped (n-type) epitaxial layer(s) of gallium nitride or its alloys and positively doped (p-type) epitaxial layers of gallium nitride or its alloys surrounding a light emitting active region; a red LED chip, such as an AlInGaP based red chip; a white LED chip (e.g., blue LED chip with phosphor(s) layer(s)), and/or a non-white phosphor based LED chip.

Traces, electrical contacts, leads and contact pads, as described herein, can comprise any suitable electrically conductive material, e.g., Cu, finished with electroless Ag, Ni—Ag, ENIG, ENIPIG, HASL, OSP, or the like. Traces can be applied over one or more surfaces of a substrate via plating (e.g., via electroplating or electroless plating), depositing (e.g., physical, chemical, and/or plasma deposition, CVD, PECVD, etc.), sputtering, or via any other suitable technique. In some aspects, traces can comprise a metal or metal alloy which may contain (in whole or part) copper (Cu), silver (Ag), gold (Au), titanium (Ti), palladium (Pd), aluminum (Al), tin (Sn), combinations thereof, and/or any other suitable conductor.

In some aspects, substrates, such as substrate 112 of FIGS. 2-5, can comprise a printed circuit board (PCB), a metal core printed circuit board (MCPCB), a flexible printed circuit board, a dielectric laminate (e.g., FR-4 boards as known in the art), a ceramic based substrate, or any other suitable substrate for mounting LED chips and/or LED packages. In some aspects such substrates can comprise one or more materials arranged to provide desired electrical isolation and high thermal conductivity. For example, at least a portion of such substrates may comprise a dielectric to provide the desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester etc. In some aspects, such substrates comprises a flexible circuit board, which can allow the substrate to take a non-planar or curved shape allowing for providing directional light emission with the solid state emitters also being arranged in a non-planar manner.

In some aspects, LEDs 102a-c can be horizontally structured so that LEDs 102a-c can be electrically connected to traces 108a-b without the use of wire bonding. For example, each of LEDs 102a-c can be a horizontally structured device where each electrical contact (e.g., the anode and cathode) can be disposed on a bottom surface of the LED 102a-c. Apparatus 100 includes die attach material 130, e.g., solder bumps. Die attaching LEDs 102a-c using any suitable material and/or technique (e.g., solder attachment, preform attachment, flux or no-flux eutectic attachment, silicone epoxy attachment, metal epoxy attachment, thermal compression attachment, bump bonding, and/or combinations thereof) can directly electrically connect LEDs 102a-c to traces 108a-b without requiring wire bonds.

In some aspects, each of LEDs 114a-c can be a device that does not comprise angled or beveled surfaces. For example, each of LEDs 114a-c can be an LED device that comprises coplanar electrical contacts on one side of the LED (bottom side) with the majority of the light emitting or transmitting surface being located on the opposite side (upper side), also know as a "flip-chip". LEDs 114a-c can be bump bonded to traces using bumps of solder (or other appropriate conductive material) and force, energy (e.g., ultrasonic), and/or heat.

In some aspects, LED devices 110, 140 and 160 can optionally include diffuse layers for optics, lenses, polarizers, anti-reflective (AR) coating, anti glare, micro lenses, light steering, parallax barrier, lenticular arrays, and so on.

As a result, the diffuse reflection of such devices can be 5% or less in the visible part of the spectrum.

In some aspects, a method for making a wavelength conversion component, comprises: providing a transparent substrate having an upper surface and a lower surface; applying a phosphor compound to the upper surface and/or lower surface of the transparent substrate; and curing the transparent substrate with applied phosphor compound, wherein the wavelength conversion component is configured to alter a wavelength of a light emitted from a light source when positioned proximate to the light source. The transparent substrate can comprise a sapphire wafer, and the phosphor compound can comprise a mixture of phosphor and silicone. The mixture of phosphor and silicone can comprise a ratio of about 1:1 to about 5:1. Applying a phosphor compound to the upper surface and/or lower surface of the transparent substrate results in a substantially uniformly applied phosphor compound to the transparent substrate such that the phosphor compound is conformal to the transparent substrate. A laser can be used to cause an internal damage layer in the transparent substrate. The method can comprise singulating the transparent substrate after application of the phosphor compound to provide a wavelength conversion component of a desired size, and the singulation can comprise singulating the transparent substrate prior to application of the phosphor compound to provide a wavelength conversion component of a desired size. Applying a phosphor compound to the upper surface and/or lower surface of the transparent substrate can comprise spraying, screen printing and/or dispensing. A silicone compound on the phosphor compound can be applied to the upper surface and/or lower surface of the transparent substrate.

A method in some aspects can comprise: providing a submount comprising an upper surface and a bottom surface; attaching one or more light emitters on the upper surface of the submount, the one or more light emitters comprising an upper surface, a lower surface, and one or more sides; applying a light affecting material to the upper surface of the submount and adjacent to the one or more sides of the one or more light emitters; and applying a wavelength conversion component on the upper surface of the one or more light emitters. The light affecting material can comprise a reflective material. The light affecting material can comprise $TiO_2$. The light affecting material can surround the sides of the one or more light emitters disposed on the upper surface of the submount. Applying a light affecting material can further comprise applying a dam material on the upper surface of the submount prior to applying the light affecting material, wherein the dam material is configured to contain the light affecting material on the upper surface of the submount and adjacent to the one or more sides of the one or more light emitters after application of the light affecting material, whereby the one or more light emitters are surrounded by the light affecting material. The dam material can be applied on the upper surface of the submount to a height substantially similar to a height of the one or more sides of the one or more light emitters, wherein the dam material is configured to contain enough light affecting material to surround the one or more light emitters at a depth substantially similar to the height of the one or more sides of the one or more light emitters. The wavelength conversion component can comprise a transparent substrate comprising an upper and lower surface, and a phosphor compound disposed on at least one or both of the upper and/or lower surface. The transparent substrate can comprise a sapphire wafer. The phosphor compound can comprise a mixture of phosphor and silicone. The wavelength conversion component can be applied to the upper surface of the one or more light emitters with the phosphor compound facing down and adjacent to the upper surface of the one or more light emitters. Applying a wavelength conversion component on the upper surface of the one or more light emitters further can comprise adding a silicone layer to the upper surface of the one or more light emitters prior to applying the wavelength conversion component. The silicone layer can further comprise fumed or fused silica. Applying the light affecting material can occur prior to applying the wavelength conversion component. Applying the wavelength conversion component can occur prior to applying the light affecting material. A method can further comprise making the wavelength conversion component, comprising: providing a sapphire wafer having an upper surface and a lower surface; applying a phosphor compound to the upper surface and/or lower surface of the transparent substrate; and curing the transparent substrate with applied phosphor compound, wherein the wavelength conversion component is configured to alter a wavelength of a light emitted from a light source when positioned proximate to the light source.

In some aspects, a light emitting diode (LED) component, can comprise: a substrate for a light emitting diode (LED); one or more copper traces on the substrate; a gold interface on the one or more copper traces; an aluminum pad configured for electrically connecting with the LED; and a layer of titanium between the aluminum pad and gold interface, wherein the layer of titanium is configured to prevent, substantially prevent, or minimize galvanic action between the aluminum pad and gold interface. The layer of titanium can be configured to extend beyond an outer periphery of the aluminum pad. The substrate can be aluminum nitride.

In some aspects, a method of making a light emitting diode (LED) component comprises: providing a substrate for a LED; providing one or more copper traces on the substrate; providing a gold interface on the one or more copper traces; applying a first photo mask to create an opening on the gold interface and applying a layer of titanium; and applying a second photo mask to create an opening on the layer of titanium and applying an aluminum pad configured for electrically connecting with the LED, wherein a layer of titanium is provided between the aluminum pad and gold interface, wherein the layer of titanium is configured to prevent, substantially prevent, or minimize galvanic action between the aluminum pad and gold interface. The layer of titanium can be configured to extend beyond an outer periphery of the aluminum pad. The substrate can be aluminum nitride.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter device comprising:
a submount comprising an upper surface and a bottom surface;
a first light emitter and a second light emitter disposed on the upper surface of the submount;
a light affecting material disposed on the upper surface of the submount and adjacent to the first light emitter and the second light emitter; and
a wavelength conversion component disposed on each of the first light emitter, the second light emitter, and the light affecting material, the wavelength conversion component comprising a transparent substrate, a first phosphor zone supported by the substrate and registered with the first light emitter, and a second phosphor zone supported by the substrate and registered with the second light emitter, wherein the second phosphor zone comprises a phosphor that is compositionally different from a phosphor of the first phosphor zone.

2. The light emitter device of claim 1, wherein the transparent substrate comprises an upper substrate surface and a lower substrate surface, and the first phosphor zone and the second phosphor zone are disposed on at least one of the upper substrate surface or the lower substrate surface.

3. The light emitter device of claim 1, wherein at least one of the first phosphor zone or the second phosphor zone comprises a spray-coated phosphor material.

4. The light emitter device of claim 1, wherein the first phosphor zone comprises a red phosphor material and the second phosphor zone comprises at least one of a yellow phosphor material or a green phosphor material.

5. The light emitter device of claim 1, wherein the light affecting material comprises a reflective material.

6. The light emitter device of claim 1, wherein:
the transparent substrate comprises an upper substrate surface, a lower substrate surface, and at least one side substrate surface bounding the upper substrate surface and the lower substrate surface; and
the light affecting material is configured to peripherally surround the at least one side substrate surface.

7. The light emitter device of claim 1, wherein:
the submount further comprises (i) electrical traces that are electrically connected to the first and second light emitters, and (ii) one or more contacts that are electrically connected to the electrical traces; and
the one or more contacts are uncovered by the light affecting material.

8. The light emitter device of claim 7, wherein the electrical traces and the one or more contacts are arranged on the upper surface of the submount.

9. The light emitter device of claim 1, wherein the first light emitter and the second light emitter are configured to emit light in a blue wavelength spectrum.

10. The light emitter device of claim 1, wherein the first light emitter and the second light emitter are separately controllable.

11. The light emitter device of claim 1, wherein the transparent substrate comprises sapphire.

12. The light emitter device of claim 1, wherein the first phosphor zone and the second phosphor zone are arranged between the transparent substrate and the submount.

13. A wavelength conversion component, comprising:
a transparent substrate having an upper surface and a lower surface;
a first spray-coated phosphor material supported by the lower surface; and
a second spray-coated phosphor material supported by the lower surface, wherein the second spray-coated phosphor material comprises a phosphor that is compositionally different from a phosphor of the first spray-coated phosphor material; and wherein the first spray-coated phosphor material and the second spray-coated phosphor material are configured to alter a wavelength of a light emitted from a light source when the lower surface is positioned proximate to the light source.

14. The wavelength conversion component of claim 13, wherein the first spray-coated phosphor material comprises a first mixture of one or more phosphor materials, and the second spray-coated phosphor material comprises a second mixture of one or more phosphor materials.

15. The wavelength conversion component of claim 13, wherein the first spray-coated phosphor material is configured to provide a first color point, and the second spray-coated phosphor material is configured to provide a second color point that differs from the first color point.

16. The wavelength conversion component of claim 13, wherein the first spray-coated phosphor material comprises a red phosphor material and the second spray-coated phosphor material comprises at least one of a yellow phosphor material or a green phosphor material.

17. The wavelength conversion component of claim 13, wherein the first spray-coated phosphor material forms a first phosphor zone and the second spray-coated phosphor material forms a second phosphor zone that is adjacent the first phosphor zone on the lower surface.

18. The wavelength conversion component of claim 13, wherein the second spray-coated phosphor material is layered over the first spray-coated phosphor material.

19. The wavelength conversion component of claim 13, wherein the first spray-coated phosphor material and the second spray-coated phosphor material comprise mixtures of silicone and one or more phosphor materials.

20. The wavelength conversion component of claim 13, wherein the transparent substrate comprises sapphire.

* * * * *